United States Patent
Gardner et al.

(10) Patent No.: US 9,206,523 B2
(45) Date of Patent: Dec. 8, 2015

(54) NANOMACHINED STRUCTURES FOR POROUS ELECTROCHEMICAL CAPACITORS

(71) Applicants: Donald S. Gardner, Mountain View, CA (US); Charles W. Holzwarth, San Jose, CA (US); Wei Jin, Sunnyvale, CA (US)

(72) Inventors: Donald S. Gardner, Mountain View, CA (US); Charles W. Holzwarth, San Jose, CA (US); Wei Jin, Sunnyvale, CA (US)

(73) Assignee: Intel Corporation, Santa Clara, CA (US)

(*) Notice: Subject to any disclaimer, the term of this patent is extended or adjusted under 35 U.S.C. 154(b) by 120 days.

(21) Appl. No.: 13/631,579

(22) Filed: Sep. 28, 2012

(65) Prior Publication Data

US 2014/0093782 A1    Apr. 3, 2014

(51) Int. Cl.

| | |
|---|---|
| *C25F 3/02* | (2006.01) |
| *C25F 3/12* | (2006.01) |
| *C25F 3/14* | (2006.01) |
| *H01M 4/76* | (2006.01) |
| *H01M 4/80* | (2006.01) |
| *H01G 11/26* | (2013.01) |
| *H01G 11/50* | (2013.01) |
| *H01G 11/86* | (2013.01) |
| *H01M 4/04* | (2006.01) |
| *H01M 4/133* | (2010.01) |
| *H01M 4/1393* | (2010.01) |
| *H01M 4/134* | (2010.01) |
| *H01L 49/02* | (2006.01) |
| *H01M 4/02* | (2006.01) |

(52) U.S. Cl.
CPC ... *C25F 3/02* (2013.01); *C25F 3/12* (2013.01); *C25F 3/14* (2013.01); *H01G 11/26* (2013.01); *H01G 11/50* (2013.01); *H01G 11/86* (2013.01); *H01M 4/0442* (2013.01); *H01M 4/133* (2013.01); *H01M 4/1393* (2013.01); *H01M 4/76* (2013.01); *H01M 4/80* (2013.01); *H01L 28/82* (2013.01); *H01M 4/134* (2013.01); *H01M 2004/021* (2013.01); *Y10T 29/49126* (2015.01)

(58) Field of Classification Search
None
See application file for complete search history.

(56) References Cited

U.S. PATENT DOCUMENTS

| | | | |
|---|---|---|---|
| 5,162,178 A | 11/1992 | Ohsawa et al. | |
| 5,450,279 A * | 9/1995 | Yoshida et al. | 361/502 |

(Continued)

FOREIGN PATENT DOCUMENTS

| | | |
|---|---|---|
| EP | 0905274 A1 | 3/1999 |
| JP | 2011-151376 A | 8/2011 |

(Continued)

OTHER PUBLICATIONS

Föll et al. (Materials Science and Engineering R 39 (2002) 93-141).*
Föll, H. et al., "Formation and application of porous silicon," Materials Science and Engineering R, vol. 280 (2002), pp. 1-49.

(Continued)

*Primary Examiner* — Carlos Barcena
*Assistant Examiner* — Wojciech Haske
(74) *Attorney, Agent, or Firm* — Blakely, Sokoloff, Taylor & Zafman LLP

(57) ABSTRACT

Embodiments of the invention describe energy storage devices, porous electrodes, and methods of formation. In an embodiment, an energy storage device includes a porous structure containing multiple main channels that extend into an electrically conductive structure at an acute angle. In an embodiment, an energy storage device includes a porous structure containing an array of V-groove or pyramid recesses.

9 Claims, 20 Drawing Sheets

(56) References Cited

U.S. PATENT DOCUMENTS

| | | | |
|---|---|---|---|
| 6,430,031 B1 * | 8/2002 | Dispennette et al. | 361/502 |
| 2003/0099884 A1 | 5/2003 | Chiang et al. | |
| 2006/0021649 A1 | 2/2006 | Kuroda et al. | |
| 2007/0212538 A1 | 9/2007 | Niu | |
| 2007/0235342 A1 | 10/2007 | Matsuo et al. | |
| 2008/0081257 A1 | 4/2008 | Yoshida et al. | |
| 2009/0142656 A1 | 6/2009 | Nathan et al. | |
| 2010/0003544 A1 | 1/2010 | Pijnenburg et al. | |
| 2010/0233539 A1 | 9/2010 | Green et al. | |

FOREIGN PATENT DOCUMENTS

| | | | |
|---|---|---|---|
| KR | 1020000048961 A | 7/2000 | |
| WO | 9815962 A1 | 4/1998 | |
| WO | WO 2011/123135 A1 | 10/2011 | |
| WO | WO 2011/124893 A2 | 10/2011 | |
| WO | WO 2011-154862 A1 | 12/2011 | |

OTHER PUBLICATIONS

PCT International Search Report and Written Opinion for International Application No. PCT/US2013/047404, mailed Oct. 8, 2013, 14 pages.

Partial Supplemental European Search Report for EP Application No. 13838055.5, mailed May 11, 2015, 7 pages.

Notification and Transmittal of International Preliminary Report on Patentability (Ch. I of the PCT) in PCT Application No. PCT/US2013/047404, dated Apr. 9, 2015; 10pgs.

Notice of Preliminary Rejection and English Translation for Korean Patent Application No. 2014-7011162, dated Mar. 24, 2015; 6pgs.

Korean Office Action (Notice of Allowance) for Application No. 2014-7011162, mailed Aug. 10, 2015, 8 pages and translation thereof.

European Search Report and Search Opinion for Application No. 13838055.5, mailed Oct. 23, 2015, 13 pages.

* cited by examiner

NANOMACHINED STRUCTURES FOR POROUS ELECTROCHEMICAL CAPACITORS

BACKGROUND

The disclosed embodiments of the invention relate generally to energy storage devices, and relate more particularly to methods of forming high surface area porous electrodes.

Modern societies depend on the ready availability of energy. As the demand for energy increases, devices capable of efficiently storing energy become increasing important. As a result, energy storage devices, including batteries, capacitors, electrochemical capacitors (ECs), (including pseudocapacitors and electric double-layer capacitors (EDLCs)—also known as ultracapacitors, among other names), hybrid ECs, and the like are being extensively used in the electronics realm and beyond. In particular, capacitors are widely used for applications ranging from electrical circuitry and power delivery to voltage regulation and battery replacement. Electrochemical capacitors are characterized by high energy storage capacity as well as other desirable characteristics including high power density, small size, and low weight, and have thus become promising candidates for the use in several energy storage applications.

In a related application PCT/US2010/029821, published as WO 2011/123135, three-dimensional structures for forming high energy density electrochemical capacitors are disclosed. In some of the disclosed embodiments, a wet etching process is used to etch pores deep into a silicon structure and the pores are filled with an electrolyte or with a high-k dielectric material and/or a thin conductive film in combination with an electrolyte.

BRIEF DESCRIPTION OF THE DRAWINGS

The disclosed embodiments will be better understood from a reading of the following detailed description, taken in conjunction with the accompanying figures in the drawings in which.

Figure 14:
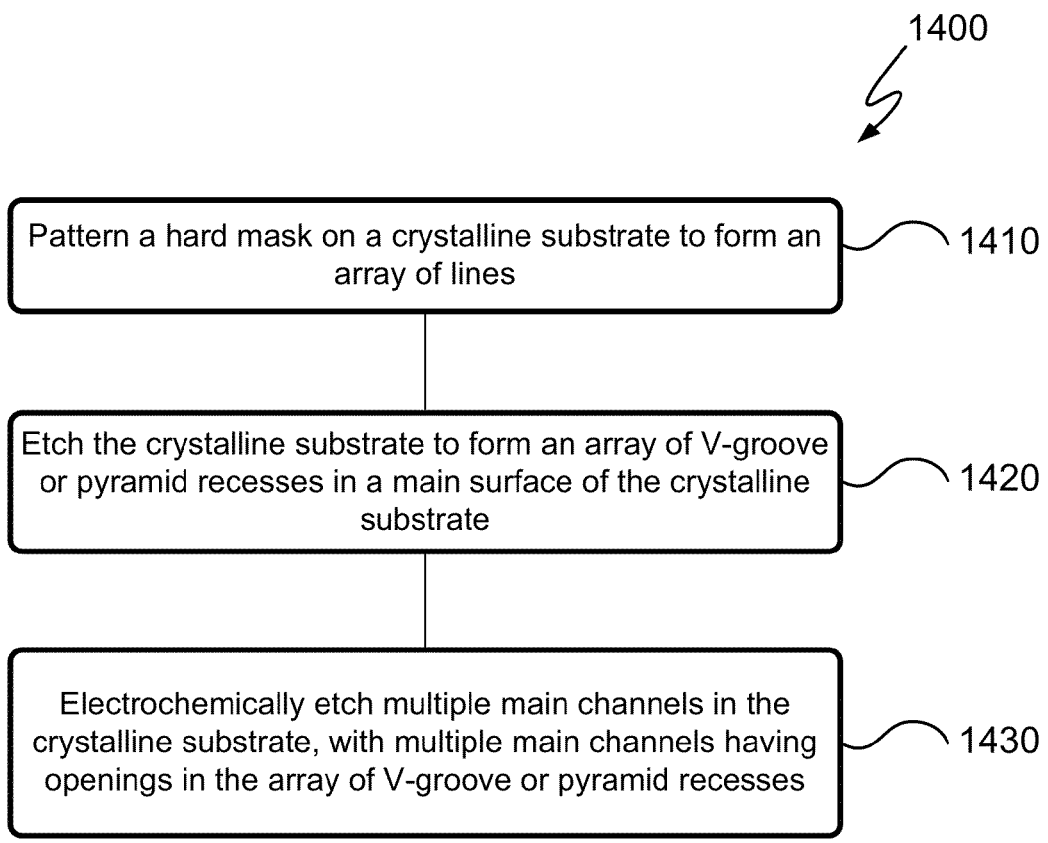
Figure 15:
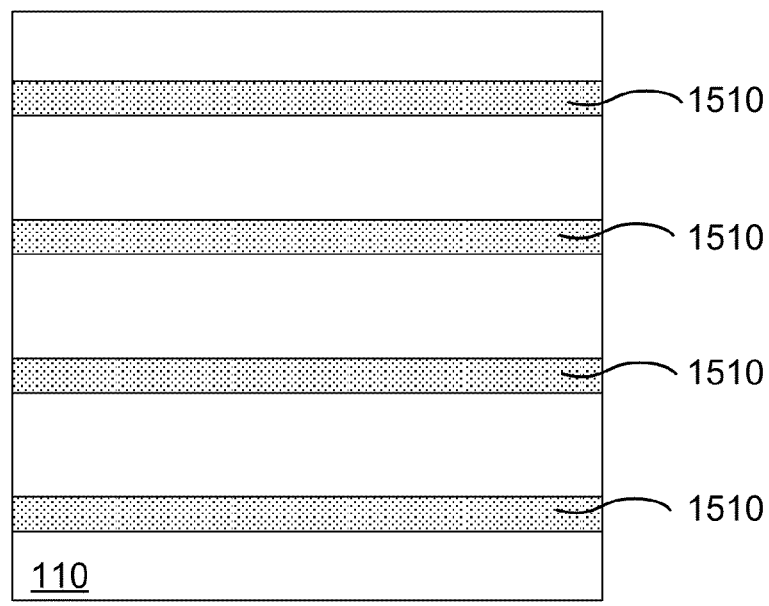
Figure 16:
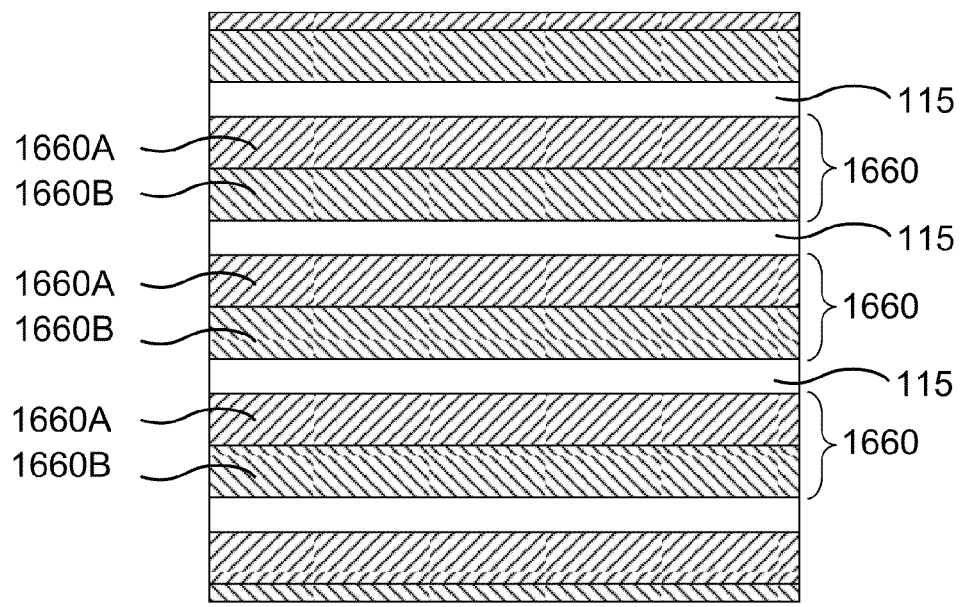
Figure 17:
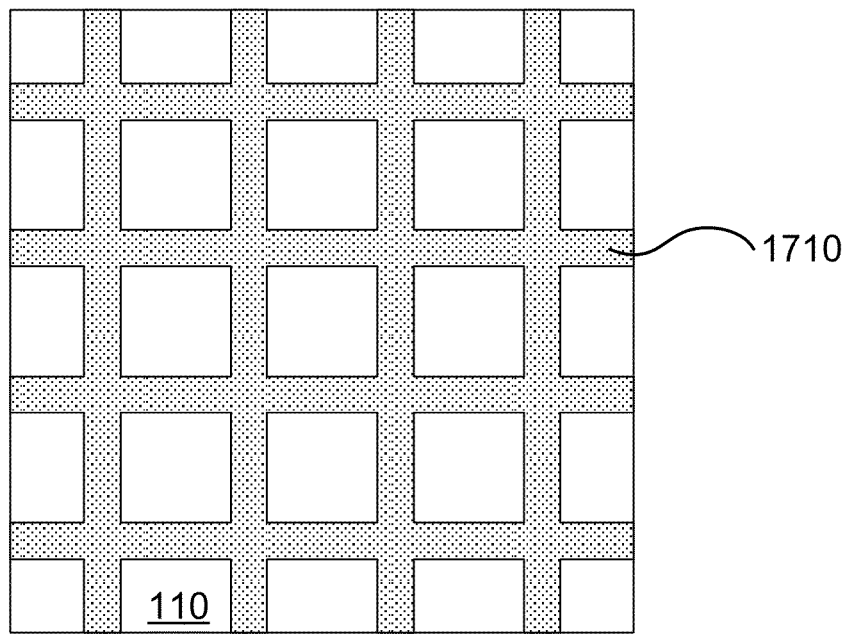
Figure 18:
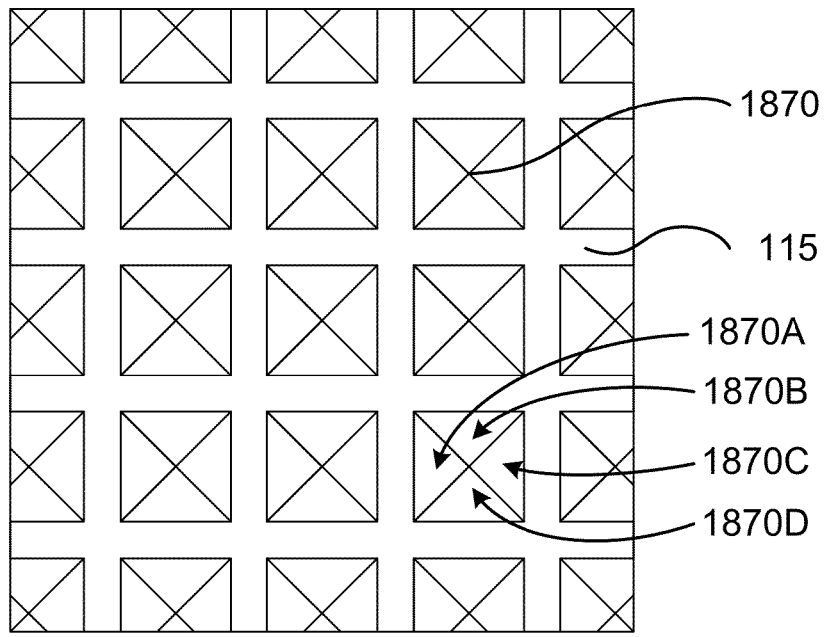
Figure 19:
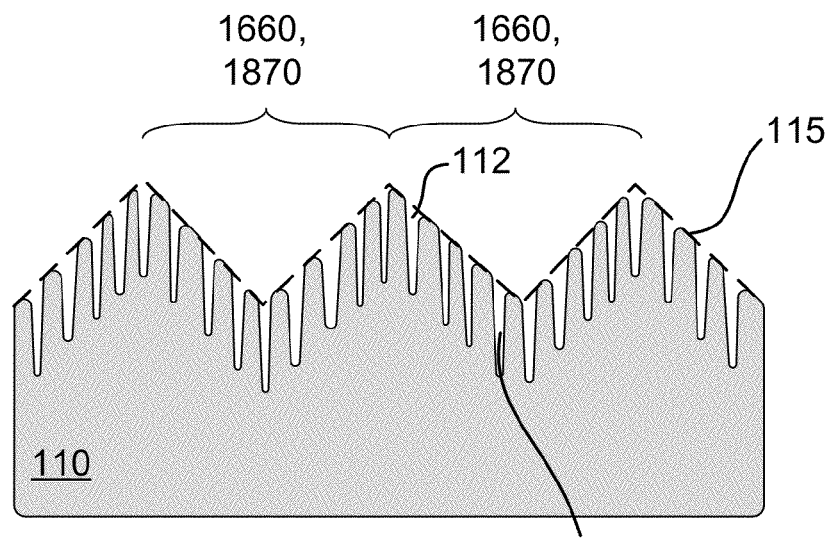
Figure 20:
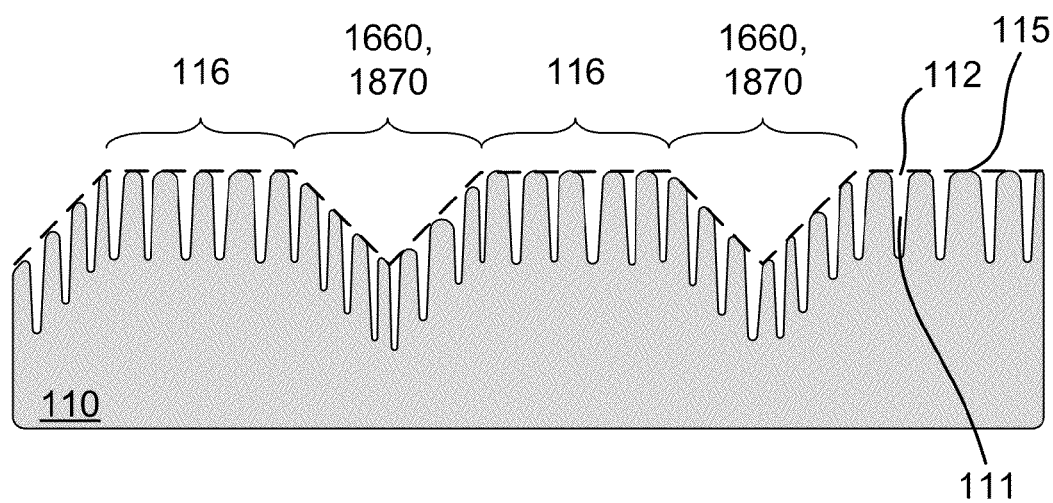
Figure 21:
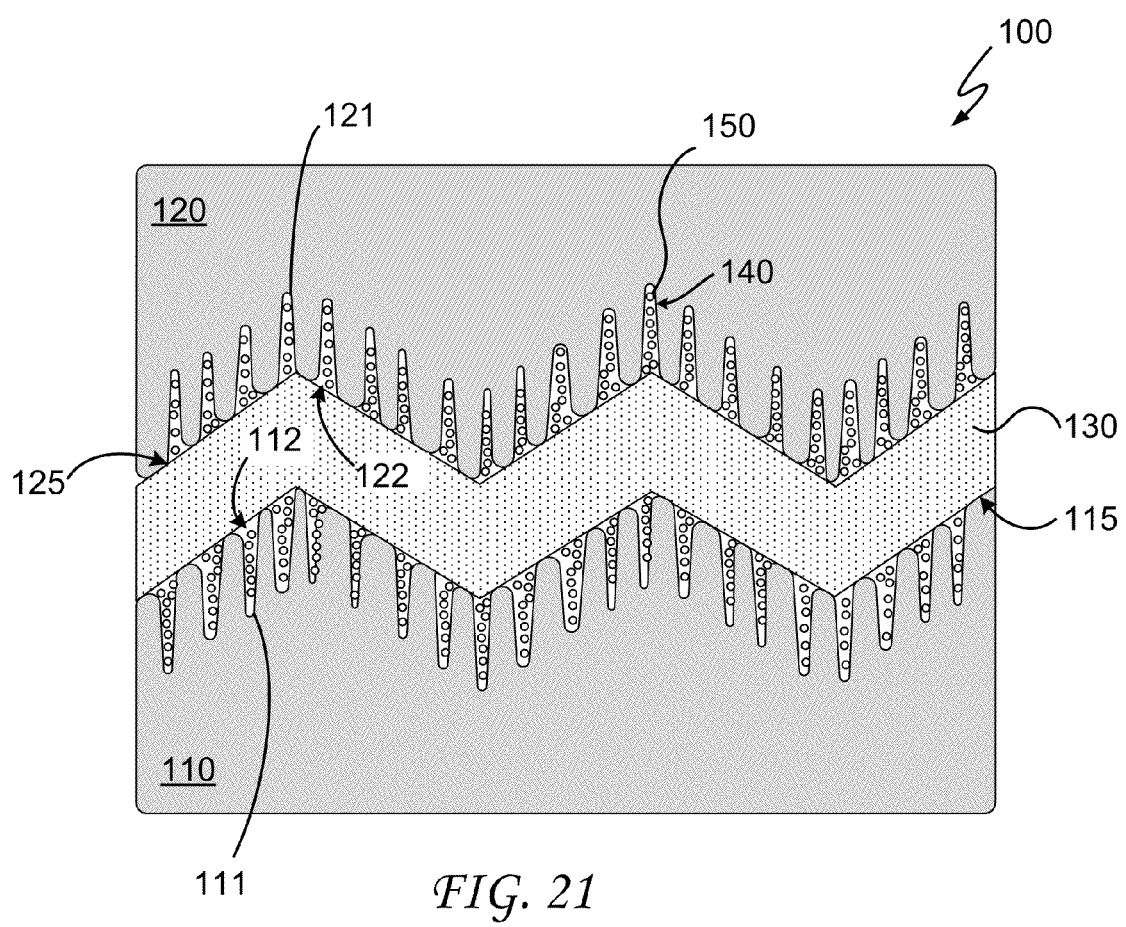
Figure 22:
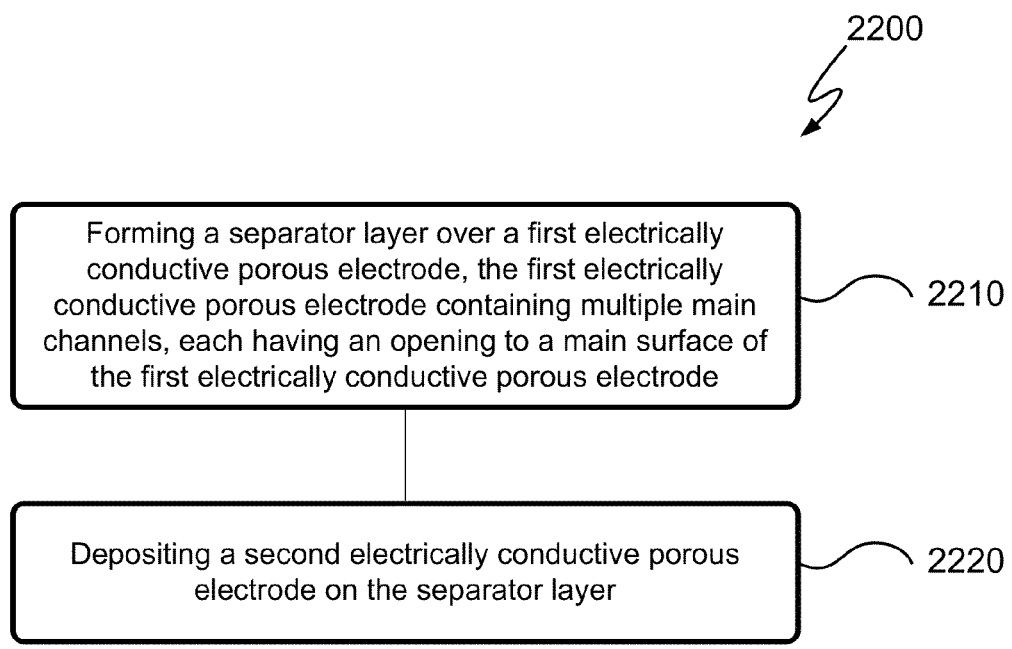
Figure 23A:
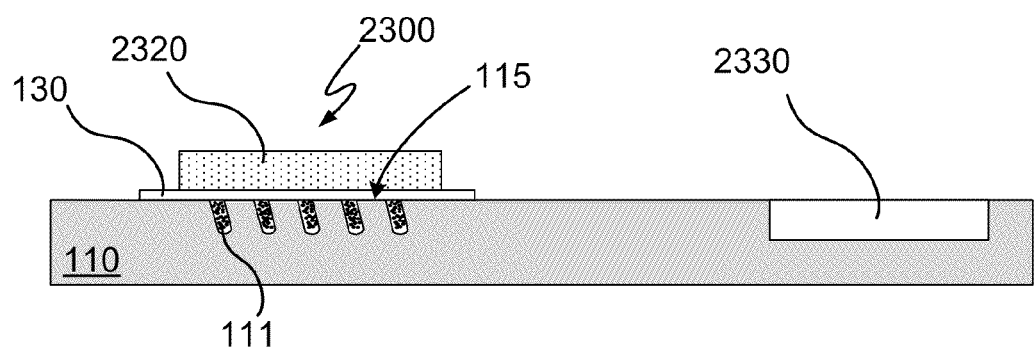
Figure 23B:
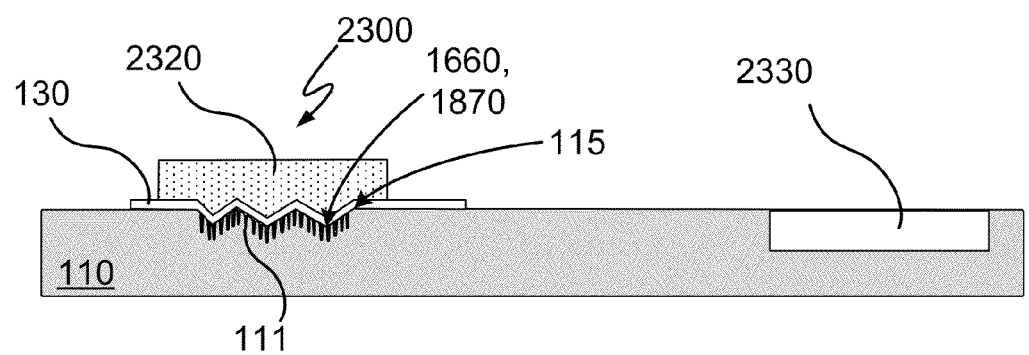
Figure 24:
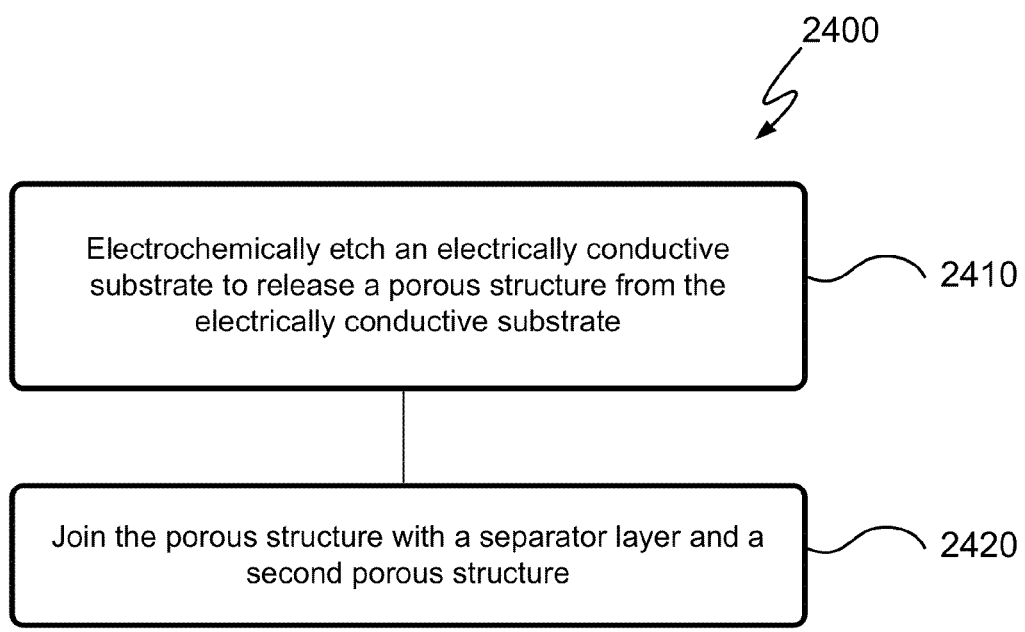
Figure 25:
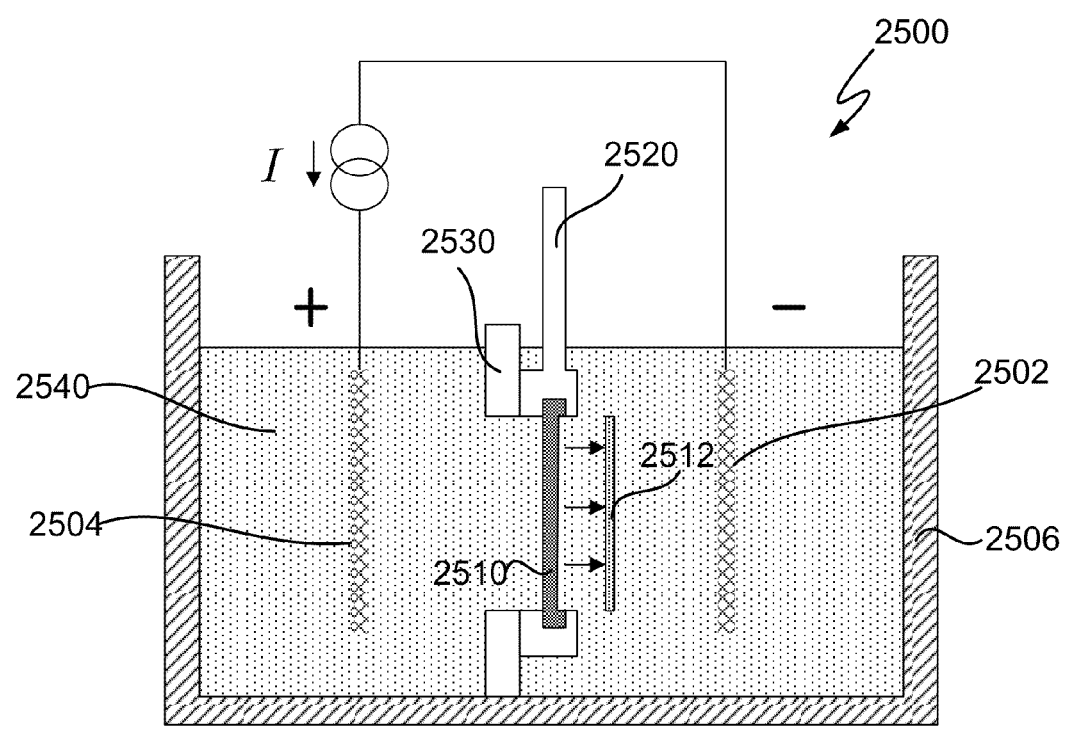
Figure 26:
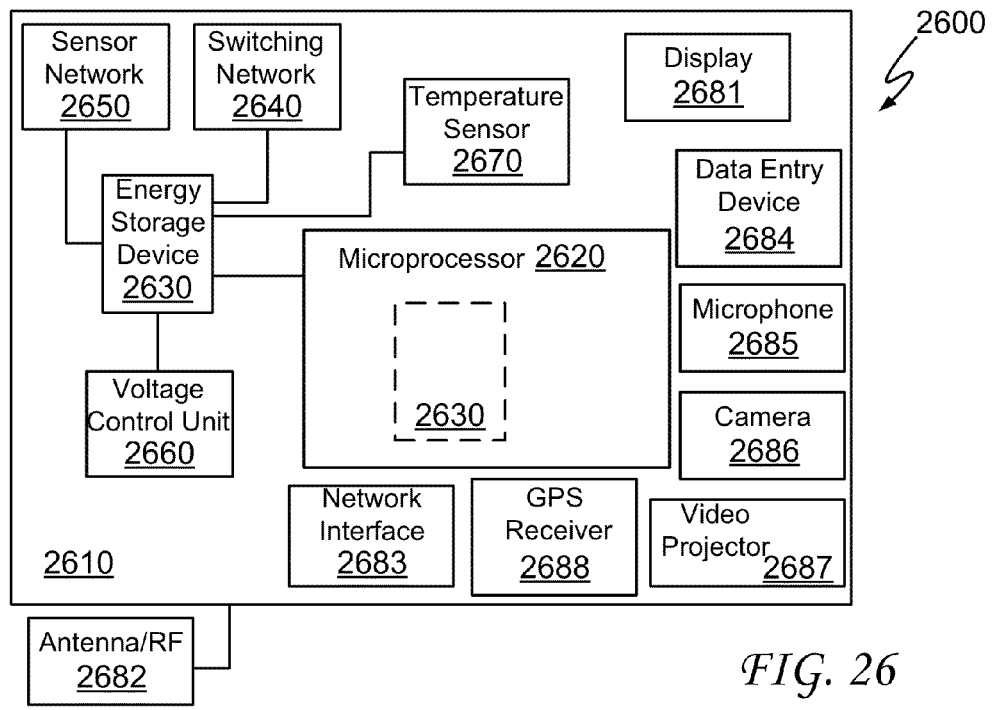
Figure 27:
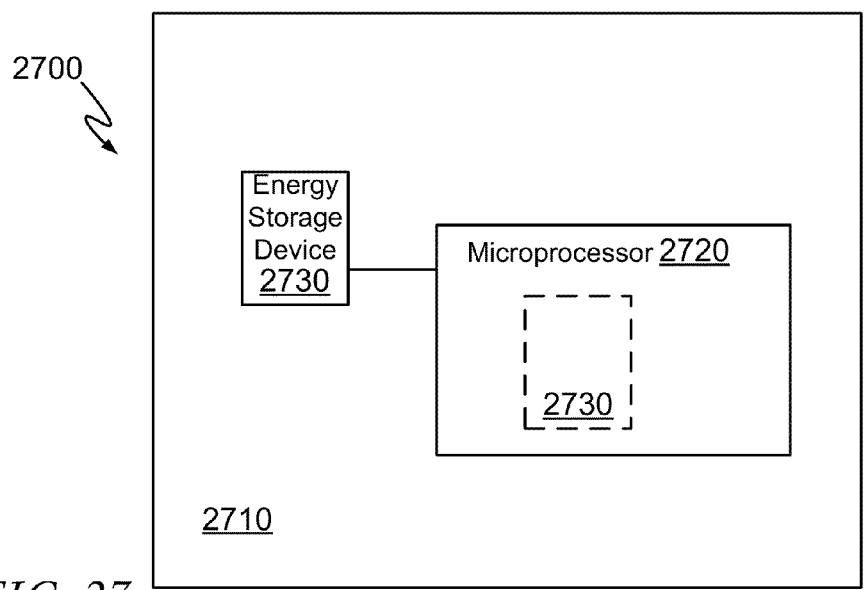

method of electrochemically etching a porous structure according to an embodiment of the invention;

FIG. 14 is a flowchart illustrating a method of forming a porous electrode with an array of V-groove or pyramid recesses according to an embodiment of the invention;

FIG. 15 is a top view illustration of an array mask lines formed over a substrate according to an embodiment of the invention;

FIG. 16 is a top view illustration of an array of V-groove recesses formed in a substrate according to an embodiment of the invention;

FIG. 17 is a top view illustration of an array mask lines formed over a substrate according to an embodiment of the invention;

FIG. 18 is a top view illustration of an array of pyramid recesses formed in a substrate according to an embodiment of the invention;

FIG. 19 is cross-sectional side view illustration of a porous structure of an energy storage device according to an embodiment of the invention;

FIG. 20 is cross-sectional side view illustration of a porous structure of an energy storage device according to an embodiment of the invention;

FIG. 21 is cross-sectional side view illustration of an energy storage device according to an embodiment of the invention;

FIG. 22 is a flowchart illustrating a method of forming an energy storage device according to an embodiment of the invention;

FIGS. 23A-23B are cross-section side view illustrations of an energy storage device according to embodiments of the invention;

FIG. 24 is a flowchart illustrating a method of forming an energy storage device according to an embodiment of the invention;

FIG. 25 is a cross-sectional side view illustration of a porous structure released from a conductive substrate in an electrochemical etching bath according to an embodiment of the invention;

FIG. 26 is a block diagram illustration of a mobile electronic device according to an embodiment of the invention; and FIG. 27 is a block diagram illustration of a microelectronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION

In one aspect, embodiments of the invention describe an energy storage device and method of forming an energy storage device in which the surface area of a porous structure containing multiple main channels within an electrically conductive structure is increased by forming the main channels along a crystal plane direction in the electrically conductive structure. In an embodiment, each of the main channels extends into the electrically conductive structure along a crystal plane direction oriented at an acute angle to the main surface of the porous structure. In an embodiment, side channels extend from a side surface of each of the main channels into the electrically conductive structure, for example along an etching current direction in an electrochemical etching bath.

In one aspect, embodiments of the invention describe an energy storage device and method of forming an energy storage device with a reduced diffusion path length. In an embodiment, an energy storage device includes a porous structure containing multiple main channels which are linearly tapered. For example, linearly tapered main channels may be formed by varying an electrochemical etching current in a nonlinear fashion. In another embodiment, the electrochemical etching current can be nonlinearly varied to form reservoirs in the multiple main channels. Such structures may reduce the diffusion path length for ions, which decreases the diffusion time constant and allows for operation of such energy storage devices at higher power.

In one aspect, embodiments of the invention describe an energy storage device and method of forming an energy storage device with a strengthened porous structure. In an embodiment, an energy storage device includes a porous structure containing multiple main channels which include a primary surface shape and a secondary surface shape superimposed on the primary surface shape. In an embodiment, a secondary electrochemical etching current variation is superimposed on a primary electrochemical current variation. For example, the secondary electrochemical etching current variation may be a linear addition of a sinusoidal function. Such a sinusoidal variation may eliminate abrupt changes in porosity, which reduces stress concentrations and strengthens the porous structure.

In one aspect, embodiments of the invention describe an energy storage device and method of forming an energy storage device in which electrochemical etching conditions are controlled to reduce pore size, thereby increasing pore surface area and capacitance of the energy storage device. In an embodiment, the electrochemical etching bath is operated at approximately room temperature or less. In an embodiment, the electrochemical etching bath includes a concentration of HF:alcohol of 2:1 or greater concentration HF. In an embodiment, the alcohol may be either isopropyl or ethyl alcohol.

In one aspect, embodiments of the invention describe an energy storage device and method of forming an energy storage device with reduced effective series resistance by increasing the surface area between the two electrodes of the energy storage device. In an embodiment, the surface area is increased by forming an array of V-groove or pyramid recesses in a main surface of a porous structure of one or both of the porous electrode structures.

In one aspect, embodiments of the invention describe a hybrid material approach for forming an energy storage device. In an embodiment, a first porous electrode is formed by electrochemically etching a porous structure in an electrically conductive substrate. In an embodiment, the first porous electrode may be integrated with other circuitry in the electrically conductive substrate. A separator and second porous electrode may then be deposited on the first porous electrode utilizing a thin film deposition technique.

In one aspect, embodiments of the invention describe an energy storage device and method of forming an energy storage device utilizing regime electrochemical etching to obtain free standing porous structures. In an embodiment, a porous structure is formed in an electrically conductive substrate submersed in an electrochemical etching bath, followed by ramping up the electrochemical etching current to release the porous structure from the electrically conductive substrate. The released porous structure is then joined with a separator layer and a second porous structure to form an energy storage device.

Although much of the discussion herein will focus on electrochemical capacitors (including pseudocapacitors and electric double-layer capacitors), the "energy storage device" designation explicitly includes, in addition to ECs, hybrid ECs, as well as batteries, fuel cells, and similar devices that store energy. Energy storage devices according to embodiments of the invention can be used for a wide variety of applications, including in automobiles, buses, trains, airplanes, other transportation vehicles, home energy storage, storage for energy generated by solar or wind energy generators (especially energy harvesting devices), and many others.

Electrochemical capacitors operate according to principles similar to those that govern conventional parallel plate capacitors, but certain important differences do apply. One significant difference concerns the charge separation mechanism. For one important class of ECs this typically takes the form of a so-called electric double layer, or EDL, rather than of the dielectric of a conventional capacitor. The EDL is created by the electrochemical behavior of ions at an interface between a high-surface area electrode and an electrolyte, and results in an effective separation of charge in spite of the fact that the layers are so close together. (Physical separation distances are on the order of a single nanometer.) Thus, a typical EDL capacitor may be thought of as storing charge in its EDL. Each layer of the EDL is electrically conductive but the properties of the double layer prevent current from flowing across the boundary between them. (The EDL is further discussed below in connection with FIG. 2.)

As is true in conventional capacitors, capacitance in an EDL capacitor is proportional to the surface area of the electrodes and inversely proportional to the charge separation distance. The very high capacitances achievable in an EDL capacitor are due in part to the very high surface area attributable to the multi-channel porous structure and to the nanometer-scale charge separation distance attributable to the EDL, which arises due to the presence of an electrolyte, as explained above. One type of electrolyte that may be used in accordance with embodiments of the invention is an ionic liquid. Another is an electrolyte comprising an ion-containing solvent. Organic electrolytes, aqueous electrolytes, and solid-state electrolytes are also possible.

Another class of electrochemical capacitor is the pseudocapacitor, where, in addition to EDL capacitance, an additional storage mechanism—one that is Faradaic and not electrostatic in origin—can arise at the surface of certain types of electrodes. The additional storage mechanism is typically referred to as "pseudocapacitance," and is characterized by a charge storage process that is similar to the operation of many solid-electrode batteries. The two storage mechanisms complement each other, leading to even greater energy storage potential than is possible with EDL capacitance alone. Typically, one of the electrodes of a pseudocapacitor is coated with a transition metal oxide such as $MnO_2$, $RuO_2$, $NiO_x$, $Nb_2O_5$, $V_2O_5$, etc., or with other materials including $Mo_2N$, $VN$, $W_2N$, $W_2C$ (tungsten carbide), $Mo_2C$, $VC$, a suitable conducting polymer, or a similar material. These materials can be used with an electrolyte such as a potassium hydroxide (KOH) solution; when the device is charged, the electrolyte will react with the material and drive a charge transfer reaction where energy is stored. More specifically, these materials store most of their energy through highly-reversible surface and near-surface electron transfer (e.g., redox (Faradaic)) reactions, which enable higher power than bulk storage in conventional batteries due to the fast charge and discharge kinetics.

It will be understood that pseudocapacitors may be constructed using electrolytes other than the one mentioned above. For example, ion-containing solvents such as $Li_2SO_4$ or $LiPF_6$ may be used as the electrolyte; these result in an intercalation reaction that involves the insertion of a species into the surface of the host structure without breaking any bonds. This reaction, like the other pseudocapacitive reactions mentioned earlier, results in a transfer of charge so it too is Faradaic and considered a redox reaction, albeit a special type of redox reaction.

Hybrid electrochemical capacitors are energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Figure 1:
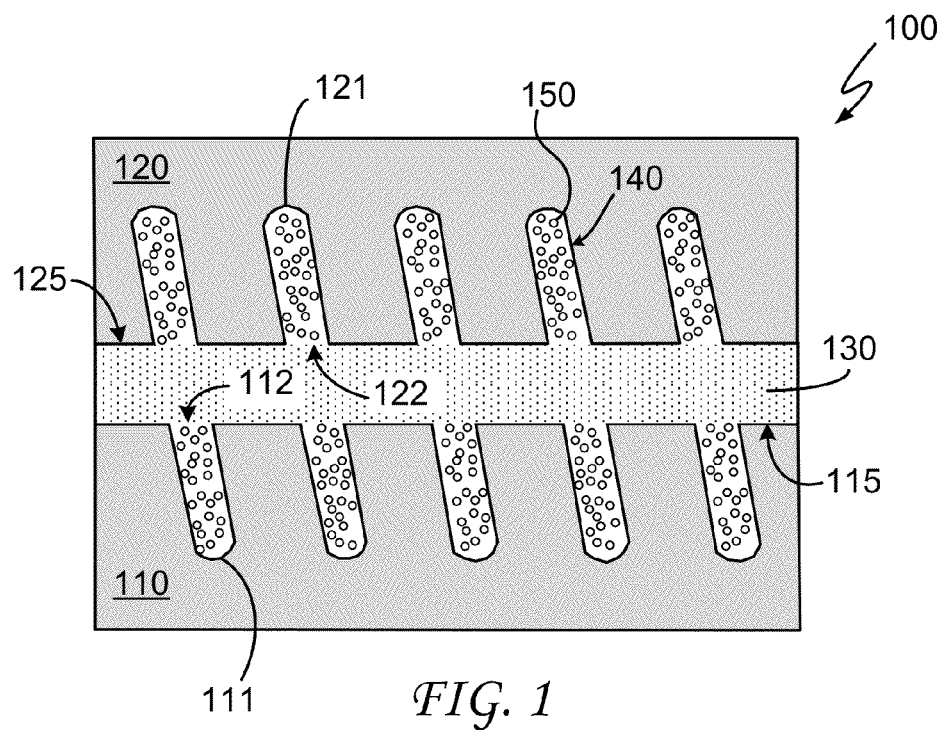
FIG. 1 is a cross-sectional side view illustration of an energy storage device according to an embodiment of the invention.

FIG. 1 is a cross-sectional view of an energy storage device 100 according to embodiments of the invention. As illustrated, energy storage device 100 comprises an electrically conductive structure 110 and an electrically conductive structure 120 separated from each other by a separator 130 that is an electrical insulator and an ionic conductor. Separator 130 prevents electrically conductive structures 110 and 120 from physically contacting each other so as to prevent an electrical short circuit. For example, separator 130 could be a permeable membrane or other porous polymer separator. In general, the separator prevents the physical contact of anode and cathode (which would cause an electrical malfunction in the device) while permitting the transfer of ionic charge carriers. In addition to polymer separators, several other separator types are possible. These include nonwoven fiber sheets, liquid membranes, polymer electrolytes, solid ion conductors, and the like. In other embodiments, a separator is not necessary and can be omitted.

At least one of electrically conductive structures 110 and 120 comprises a porous structure. In the embodiment illustrated in FIG. 1, both of the electrically conductive structures comprise an electrically conductive porous structure. In accordance with some embodiments, the porous structures contain multiple main channels 111 and 121, each one of which has an opening to a main surface of the respective porous structure. This feature may be the result of an electrochemical etching process, described below, used to form the porous structure. As an example, the porous structure may be formed within an electrically conductive material such as a conductive material or semiconductive material. Alternatively, the porous structure may be formed within an insulating material (e.g. alumina) that has been coated with an electrically conductive film (e.g., an ALD conductive film such as titanium nitride (TiN)). In this regard, materials having greater electrical conductivity are advantageous because they lower the effective series resistance (ESR). In the illustrated embodiments both electrically conductive structure 110 and electrically conductive structure 120 comprise such a porous structure. Accordingly, electrically conductive structure 110 comprises main channels 111 with openings 112 to a main surface 115 of the corresponding porous structure and electrically conductive structure 120 comprises main channels 121 with openings 122 to a main surface 125 of the corresponding porous structure. In an embodiment where only one of electrically conductive structures 110 and 120 comprises a porous structure with multiple main channels, the other electrically conductive structure can be, for example, a metal electrode, a polysilicon structure, carbon, a carbon-based material, Li-ion containing material or a pseudocapcitive material.

In an embodiment, a porous silicon structure may be created by etching an electrically conductive silicon substrate with a mixture of hydrofluoric acid and alcohol in an electrochemical etching bath. However, embodiments of the invention are not limited to porous silicon structures, nor are embodiments of the invention limited to electrochemical etching. Electrochemical etching is described herein as one method of forming a porous structure in an electrically conductive structure. Besides porous silicon, some other materials that may be especially well-suited for energy storage devices according to embodiments of the invention are porous germanium and porous tin. Possible advantages of using porous silicon include its compatibility with existing silicon technology. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge—which is an undesirable result—especially where the silicon porosity is greater than about 20 percent.) Porous germanium is also highly compatible with silicon technology. Possible advantages of using porous tin, which is a zero-band-gap material, include its enhanced conductivity with respect to certain other conductive and semiconductive materials. Other materials may also be used for the porous structure, including silicon carbide, alloys such as an alloy of silicon and germanium, and metals such as copper, aluminum, nickel, calcium, tungsten, molybdenum, and manganese.

Energy storage device 100 may optionally include a coating 140 on at least a portion of the porous structure and in at least some of main channels 111 and/or main channels 121. In an embodiment, coating 140 is a dielectric layer. The dielectric layer may be introduced to further enhance the capacitance of the energy storage device, or for other reasons such as, but not limited to, surface passivation and wettability enhancement. In an embodiment, coating 140 is an electrically conductive coating to maintain or enhance the conductivity of the porous structure, or it may be helpful in reducing ESR, thereby improving performance. For example, a device having lower ESR is able to delivery higher power (which may be manifested in terms of greater acceleration, more horse power, etc.). In contrast, higher ESR (a condition that prevails inside a typical battery) limits the amount of available energy, at least partially due to the fact that much of the energy is wasted as heat.

Figure 2:
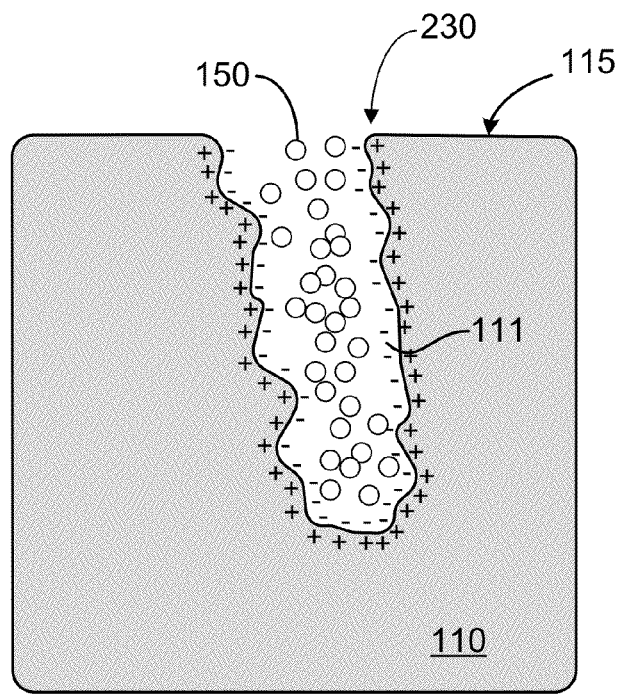
FIG. 2 is a cross-sectional side view illustration of an electric double layer within a porous structure of an energy storage device according to an embodiment of the invention.

Also illustrated in FIG. 1 is an electrolyte 150, which gives rise to the electrical double layer (EDL). The EDL is depicted schematically in FIG. 2. As illustrated in FIG. 2, an EDL 230 has been formed within one of main channels 111. EDL 230 is made up of two layers of charge, one of which is the electrical charge of the sidewalls of main channel 111 (depicted as being positive in FIG. 2 but which could also be negative) and the other of which is formed by free ions in the electrolyte. EDL 230 electrically insulates the surface, thus providing the charge separation necessary for the capacitor to function. The large capacitance and hence energy storage potential of EDLCs arises due to the small (approximately 1 nm) separation between electrolyte ions and the electrode surface charge. In some embodiments electrolyte 150 is organic. One type of electrolyte that may be used in accordance with embodiments of the invention is an ionic solution (liquid or solid). Another is an electrolyte (e.g., $Li_2SO_4$, $LiPF_6$) comprising an ion-containing solvent. As one example, the electrolyte can be a liquid or solid solution of organic materials such as tetraethylammonium tetrafluoroborate in acetonitrile. Other examples include solutions based on boric acid, sodium borate, or weak organic acids. Organic electrolytes and solid-state electrolytes are also possible. Electrolyte 150 (as well as other electrolytes described herein) is represented in the drawings using a random arrangement of circles. This representation is intended to convey the idea that the electrolyte is a substance (liquid or solid, including gel-like materials) containing free ions. The circles were chosen for convenience and are not intended to imply any limitation as to the components or qualities, including any limitation with respect to the size, shape, or number of the ions.

Figure 3:
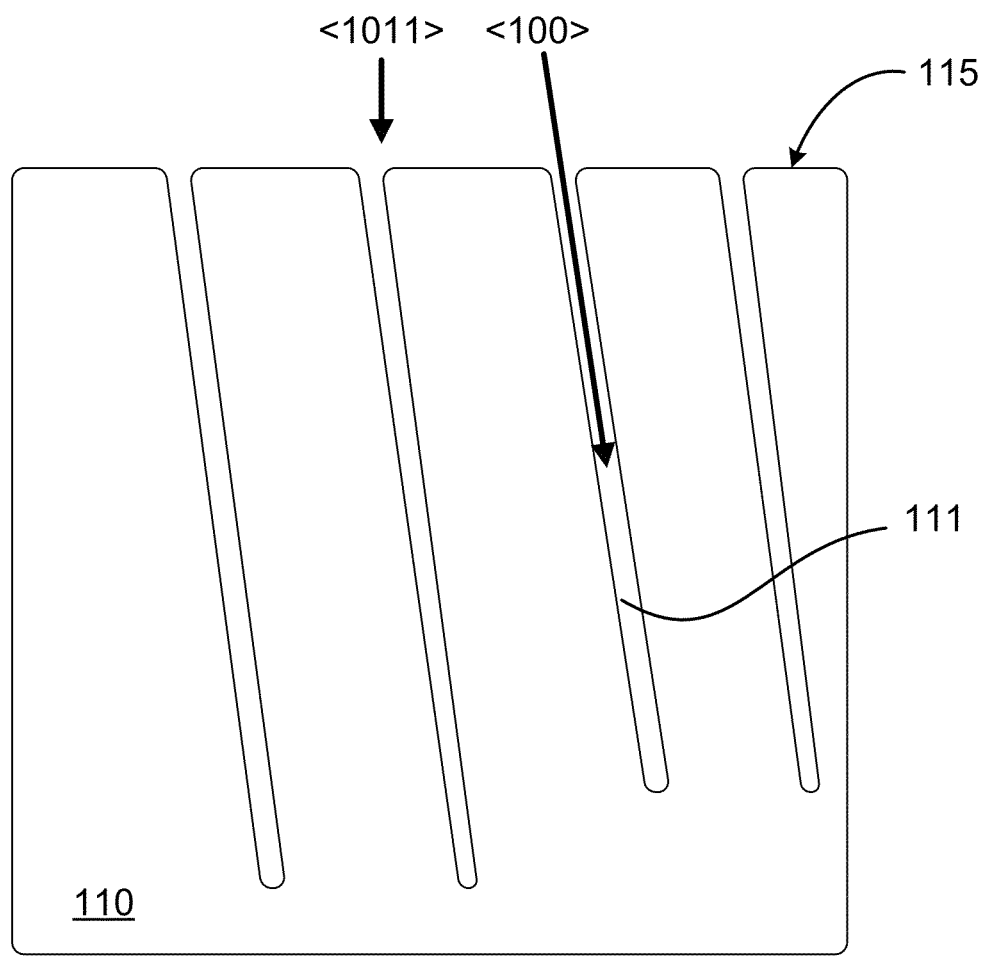
FIG. 3 is a cross-sectional side view illustration of a porous structure formed in a (1011) silicon surface according to an embodiment of the invention.
Figure 6:
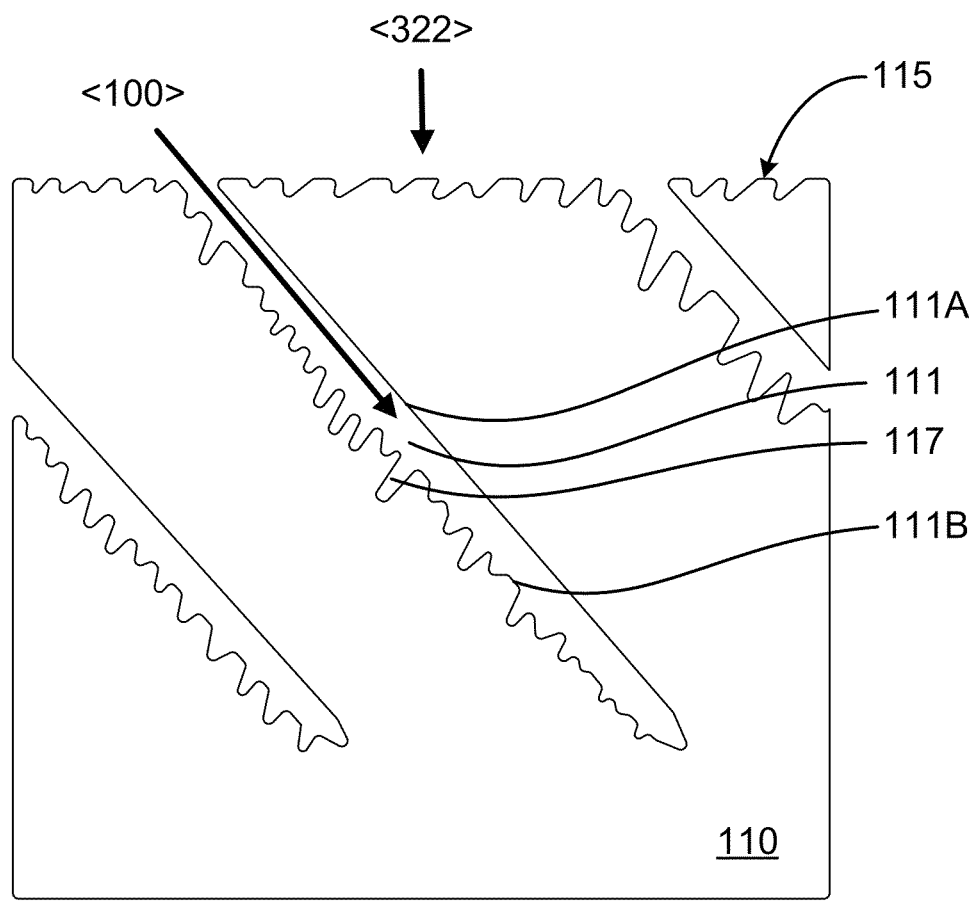
FIG. 6 is a cross-sectional side view illustration image of a porous structure formed in a (322) silicon surface according to an embodiment of the invention.
Figure 7:
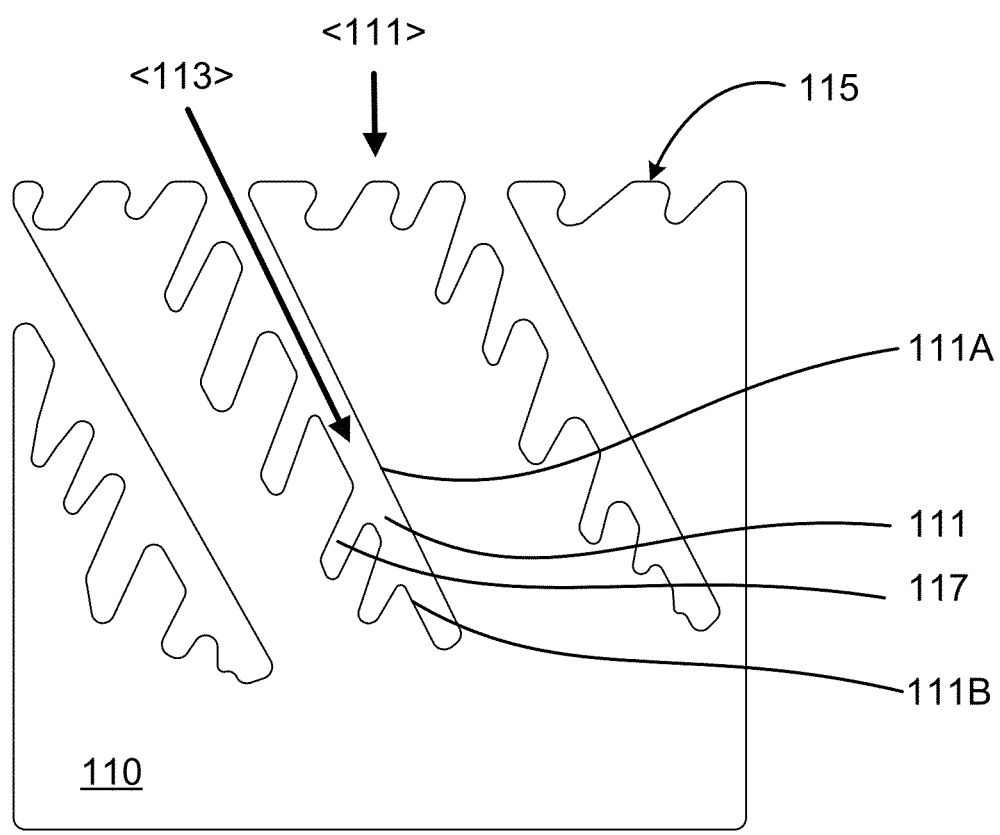
FIG. 7 is a cross-sectional side view illustration of a porous structure formed in a (111) silicon surface according to an embodiment of the invention.

It should also be noted that the depictions of the porous structures in FIG. 1 are highly idealized in that, to mention just one example, all of main channels 111 and 121 are shown as extending in a single direction. In reality the main channels may have coarse surfaces and branch off in multiple directions. Exemplary porous structures are shown in FIG. 3 and FIGS. 6-7. Similarly, the surfaces of the main channel 111 in FIG. 2 are illustrated as being coarse.

Figure 4:
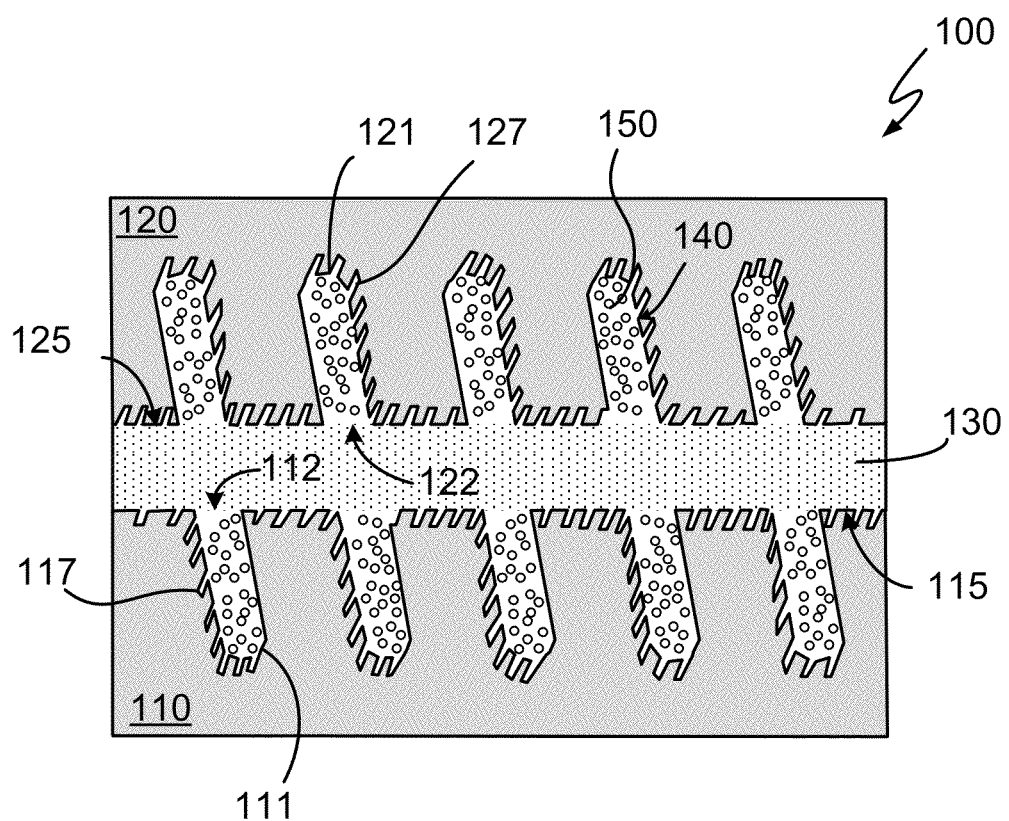
FIG. 4 is cross-sectional side view illustration of an energy storage device according to an embodiment of the invention.

In an embodiment, the porous structure of electrically conductive structure 110 and/or 120 contains multiple main channels 111, 121 within the electrically conductive structure 110, 120, and each of the main channels has an opening 112, 122 to a main surface 115, 125 of the corresponding porous structure, and each of the main channels 111, 121 extends into the electrically conductive structure 110, 120 at an acute angle to the main surface 115, 125. The multiple main channels 111, 121 may be "current-line" oriented by etching into the electrically conductive structure in the direction of local current flow during electrochemical etching, or the multiple main channels 111, 121 may be preferentially etched in a crystallographic direction into the electrically conductive structure. In an embodiment, the main surface 115 is a (1011) surface, and each of the main channels 111 extends into the electrically conductive structure 110 along a <100> crystal plane direction at the acute angle to the main surface, as shown in the cross-sectional side view illustration provided in FIG. 3. In an embodiment, side channels extend from a side surface of each of the main channels into the porous structure. FIG. 4 is cross-sectional side view illustrating an energy storage device 100 similar to the one illustrated in FIG. 1 according to embodiments of the invention. As illustrated, porous structures of electrically conductive structures 110 and/or 120 contain multiple main channels 111, 121 with each one of the main channels having an opening 112, 122 to a main surface 115, 125 of the corresponding porous structure. In addition, side channels 117, 127 are formed in a side surface of the main channels 111, 121 and the main surfaces 115, 125.

Figure 5:
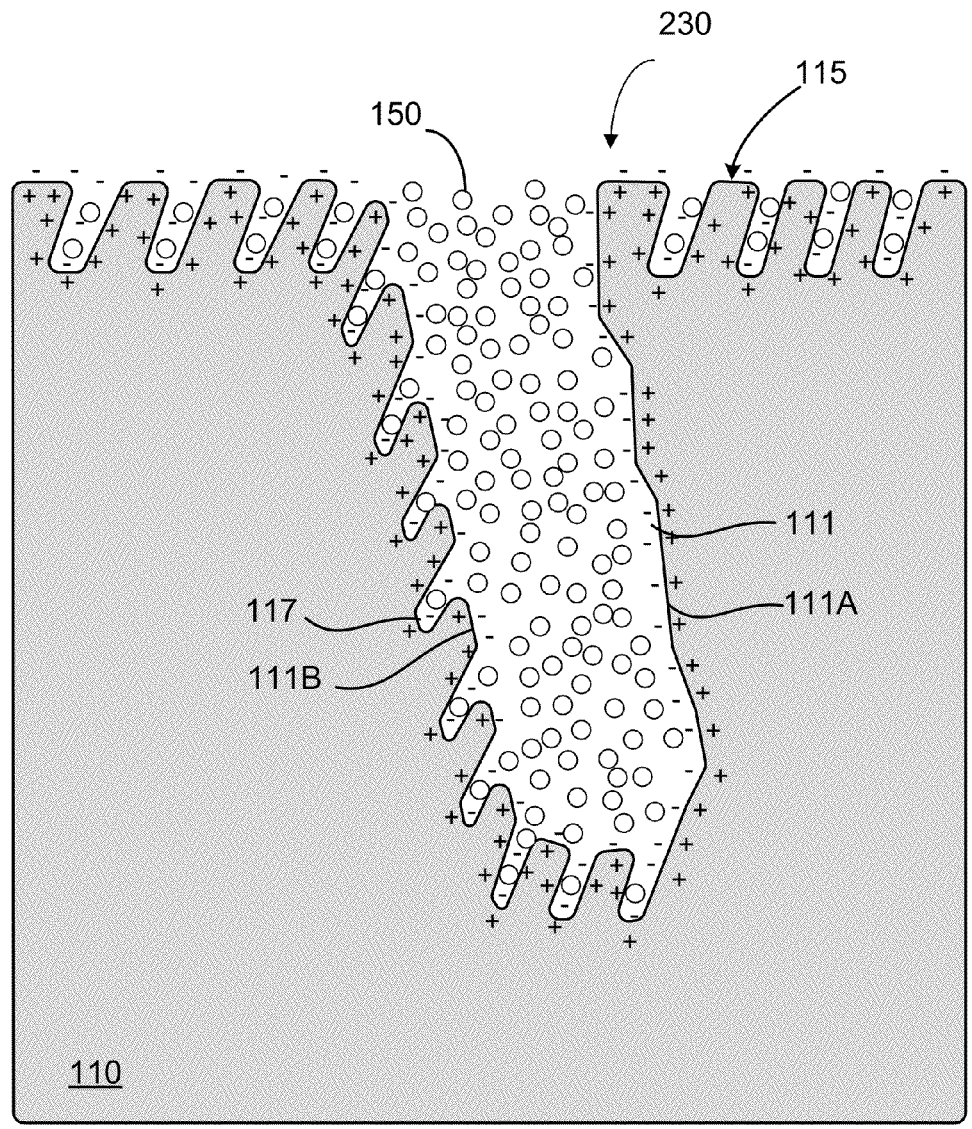
FIG. 5 is close-up cross-sectional side view illustration of a main channel according to an embodiment of the invention.

FIG. 5 is close-up cross-sectional side view illustration of a main channel 111 formed in the electrically conductive structure 110 according to an embodiment of the invention. As illustrated in FIG. 5, side channels 117 are preferentially formed in side surface 111B as opposed to side surface 111A. In an embodiment, the preferential formation of side channels 117 is made along the electrochemical etching current direction. FIG. 6 is a cross-sectional side view illustration of a porous structure formed in a (322) silicon surface according to an embodiment of the invention. As illustrated, main channels 111 extend into the electrically conductive structure 110 along the <100> crystal plane direction at an acute angle to the (322) main surface 115 of the porous structure. Side channels 117 are preferentially formed in a side surface 111B compared to side surface 111A. FIG. 7 is a cross-sectional side view illustration of a porous structure formed in a (111) silicon surface according to an embodiment of the invention. As illustrated, main channels 111 extend into the electrically conductive structure 110 along the <113> crystal plane direction at an acute angle to the (111) main surface 115 of the porous structure. Side channels 117 are preferentially formed in a side surface 111B compared to side surface 111A. In another embodiment, main channels extend into an electrically conductive (5512) substrate along a <100> crystal plane direction.

Referring again to FIGS. 1 and 4, an energy storage device 100 includes a first porous structure, a second porous structure, and a separator 130 between the first and second porous structures. The second porous structure may contain multiple second main channels 121 extending into a second electrically conductive structure 120 at a second acute angle to a second main surface 125, with each of the second main channels having a second opening 122 to the second main surface 125. In an embodiment, the multiple main channels 111 of the first porous structure, and the multiple main channels 121 of the second porous structure are parallel to each other. For example, the main surfaces 115, 125 may be formed along the same crystallographic plane. In an embodiment, the main surface is formed along a (1011), (322), (111), or (5512) crystallographic plane.

As will be described in further detail below, the main channels may be formed to reduce diffusion time constant. In an embodiment, the main channels are linearly tapered. In an embodiment, the main channels include reservoirs. For example, the main channels may include an hourglass shape with alternating reservoir regions and connecting regions, with the reservoir regions being wider than the connecting regions.

As will be described in further detail below, the main channels may be formed to strengthen the porous structure. For example, the multiple main channels may include a primary surface shape, and a secondary surface shape superimposed on the primary surface shape. In an embodiment, the primary surface shape is linear or a linear taper. In an embodiment, the secondary surface shape is sinusoidal. Such a sinusoidal variation may eliminate abrupt changes in porosity, which reduces stress concentrations and strengthens the porous electrode structure.

As will be described in further detail below, the electrochemical etching bath conditions may also be controlled when etching the main channels to reduce pore size, and increase surface area by driving down etching batch temperature, and driving up the hydrofluoric acid (HF) concentration of the etching bath to slow down the oxidation and oxide removal sequence.

It is to be appreciated that while many of the following variations are described separately, that certain embodiments are not necessarily separate and may be combined when appropriate.

In an embodiment, a porous electrode is formed by electrochemically etching multiple main channels into an electrically conductive substrate so each main channel has an opening to a main surface of the electrically conductive substrate, and each of the main channels extends into the electrically conductive substrate at an acute angle to the main surface. The multiple main channels can be formed at the acute angle along a direction of current flow in an electrochemical etching bath, or can be formed along a crystallographic plane direction in the electrically conductive substrate. In an embodiment, electrochemical etching includes immersing the electrically conductive substrate in an etching bath comprising hydrofluoric acid or an organic electrolyte such as dimethyl sulfoxide (DMSO). The electrochemical etching process is highly anisotropic by itself, but typically during the electrochemical etching process a second, isotropic etching mechanism is slowly taking place. This second etching mechanism may include the spontaneous oxidation of the conductive substrate (e.g. silicon) by an oxidizing species present in the etching bath (e.g. water) and removal of this oxide by hydrofluoric acid. In accordance with an embodiment, the amount of oxidizing species in the electrochemical etching bath is reduced in order to decrease the rate of the isotropic etching mechanism, resulting in enhanced anisotropy of the overall etch.

Figure 8:
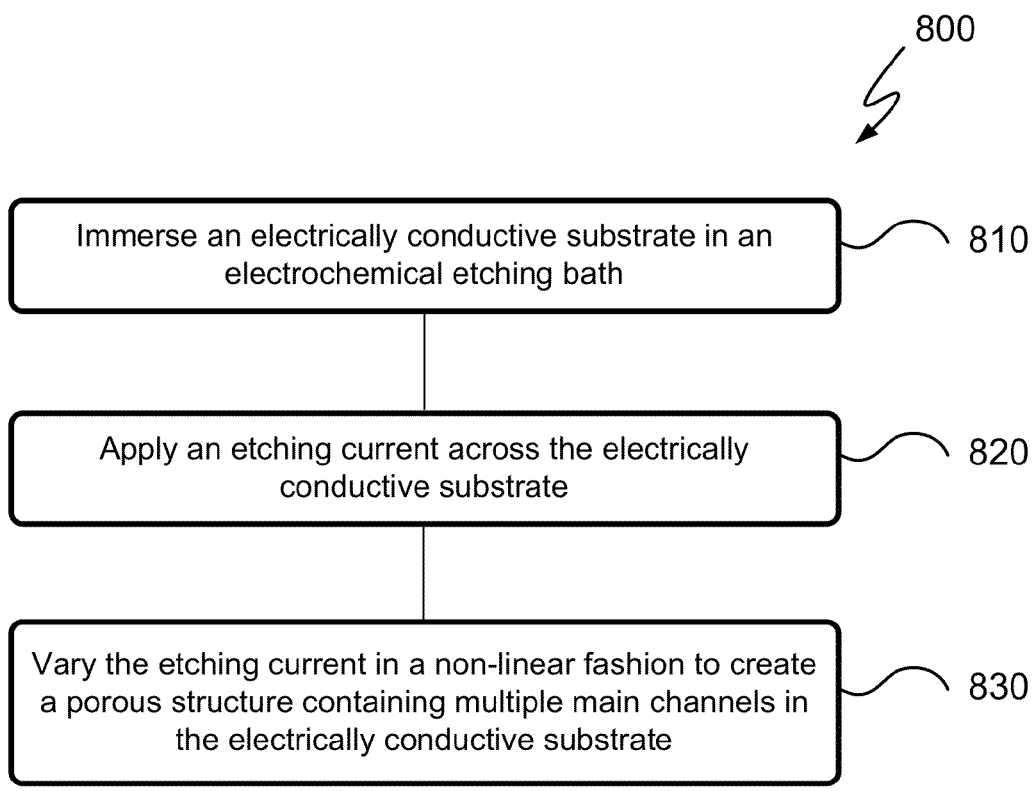
FIG. 8 is a flowchart illustrating a method of forming a porous electrode according to an embodiment of the invention.

FIG. 8 is a flowchart illustrating a method of forming a porous electrode according to an embodiment of the invention. As shown, at operation 810 an electrically conductive substrate is immersed in an electrochemical etching bath. At operation 820 an etching current is applied across the electrically conductive substrate. At operation 830 the etching current is varied in a non-linear fashion to create a porous structure containing multiple main channels in the electrically conductive substrate, with each one of the main channels having an opening to a main surface of the porous structure.

Figure 9:
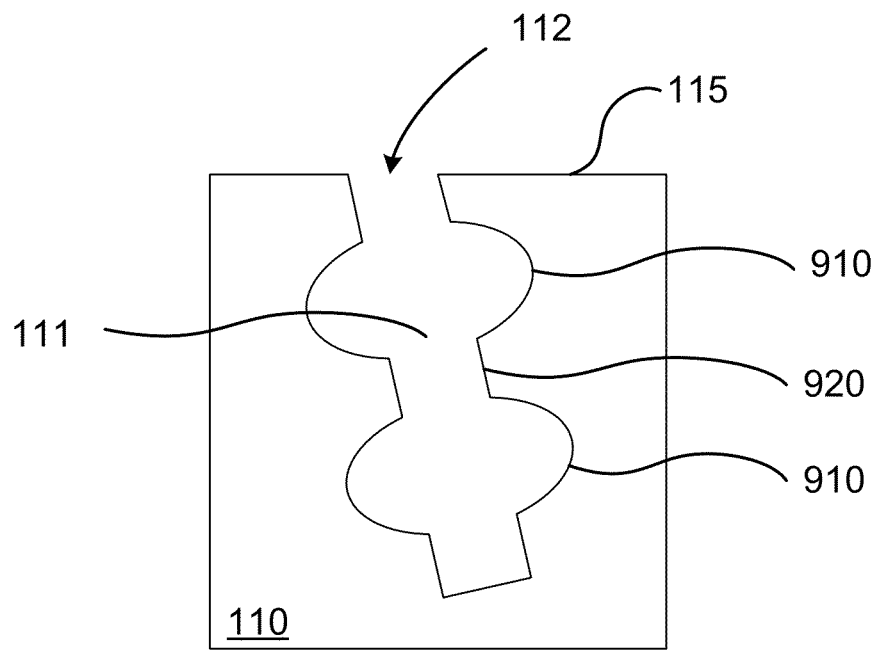
FIGS. 9-10 are schematic cross-sectional side view illustrations of a porous structure according to embodiments of the invention.
Figure 10:
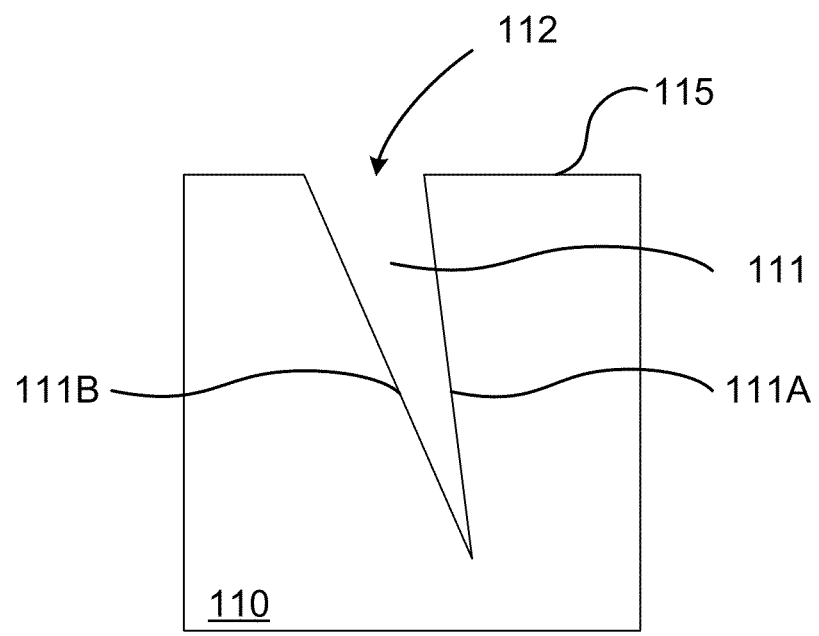

In accordance with embodiments of the invention, the method illustrated in FIG. 8 may be utilized to form an energy storage device with a reduced diffusion path length, which decreases the diffusion time constant and allows for operation of such energy storage devices at higher power. The method illustrated in FIG. 8 may also be implemented during the formation of a porous electrode such as the conductive structures 110 and 120 illustrated in FIG. 1 and FIG. 4 or during the formation of other porous structures described below such as with respect to FIGS. 19-21, and FIGS. 24-25. In an embodiment, varying the etching current in a non-linear fashion at operation 830 includes varying the etching current in alternating nodes of relatively higher and lower current. For example, this may result in alternating reservoir regions 910 and connecting regions 920 as shown in the embodiment illustrated in FIG. 9, where the reservoir regions are wider than the connecting regions. In an embodiment, the main channels 111 have an average width of approximately 0.05-5 µm, or more specifically approximately 0.2 µm, and variation of the width is approximately 0.01-0.25 µm between the reservoir regions 910 and connecting regions 920. In an embodiment, varying the etching current in a non-linear fashion at operation 830 includes continuously lowering the etching current. For example, this may result in inwardly tapered sidewalls 111A, 111B from the main surface 115 to a bottom of each main channel 111 as shown in the embodiment illustrated in FIG. 10. In an embodiment, the width at the bottom of main channel 111 is between 0.01-0.25 µm less than the width of main channel 111 at the main surface 115. It is to be appreciated that while the main channels 111 illustrated in FIGS. 9-10 are at an acute angle to the main surface, that such an illustration is exemplary and that embodiments of the invention are not so limited. For example, the alternating reservoir regions and connecting regions of FIG. 9 or the inwardly tapered sidewalls of FIG. 10 can be implemented in the embodiments illustrated in FIGS. 19-21 and FIG. 23B where the main channels are illustrated as being orthogonal to the main surface.

Figure 11:
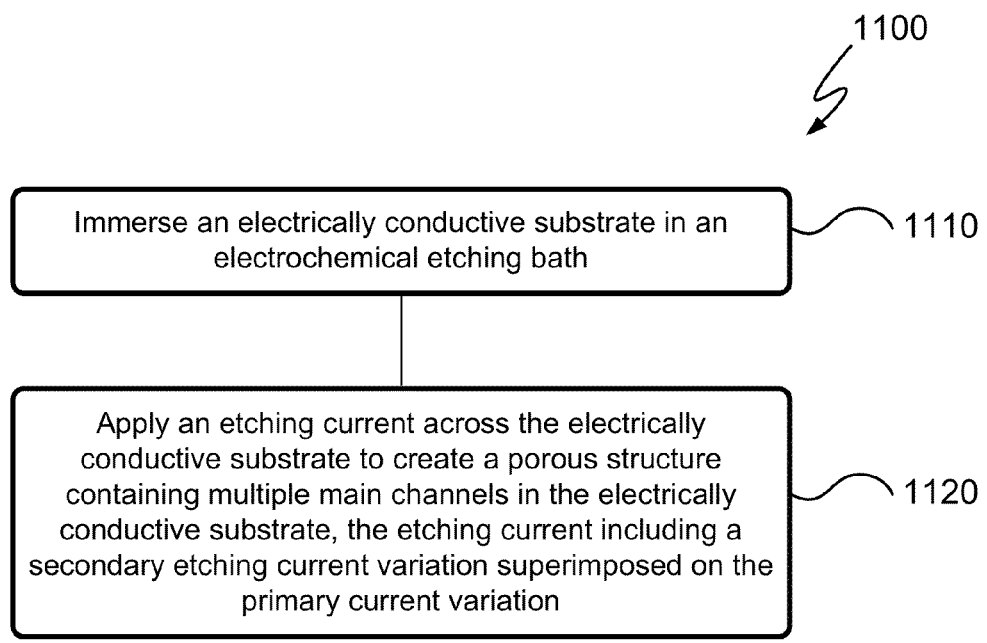
FIG. 11 is a flowchart illustrating a method of forming a porous electrode according to an embodiment of the invention.

FIG. 11 is a flowchart illustrating a method of forming a porous electrode according to an embodiment of the invention. As shown, at operation 1110 an electrically conductive substrate is immersed in an electrochemical etching bath. At operation 1120 an etching current is applied across the electrically conductive substrate to create a porous structure containing multiple main channels in the electrically conductive substrate, with each one of the main channels having an opening to a main surface of the porous structure, and where the etching current includes a secondary etching current variation superimposed on a primary current variation.

Figure 12:
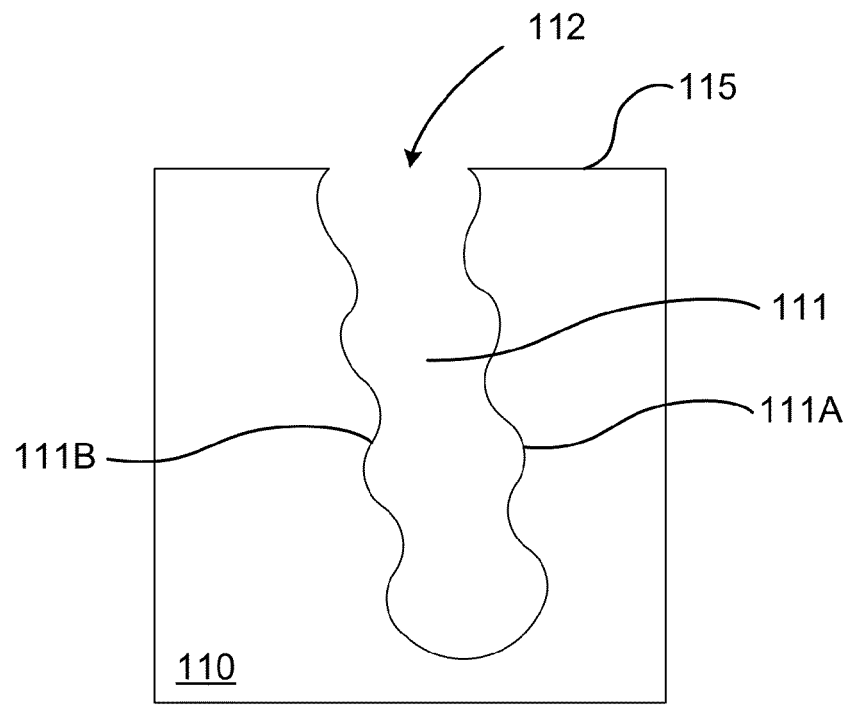
FIGS. 12-13 are schematic cross-sectional side view illustrations of a porous structure according to embodiments of the invention.
Figure 13:
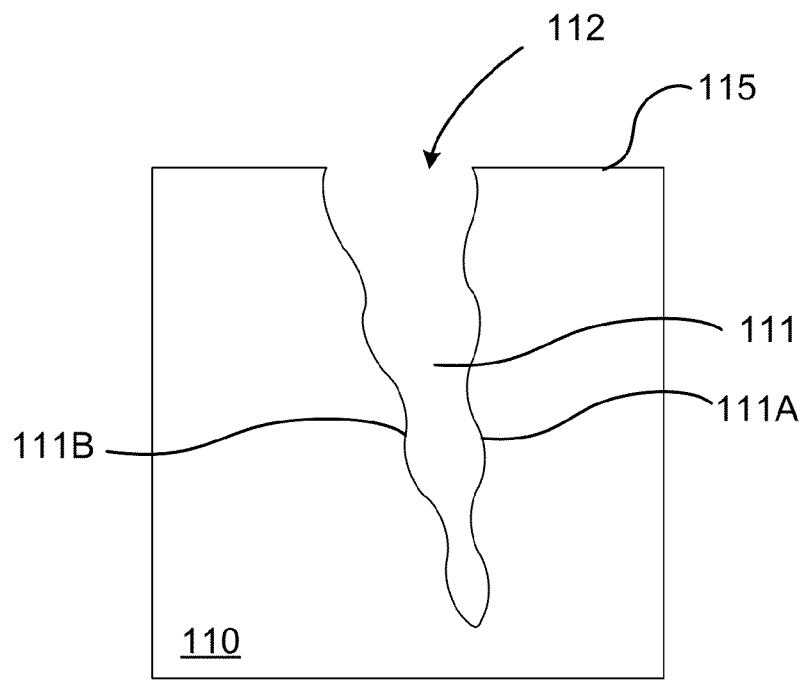

In accordance with embodiments of the invention, the method illustrated in FIG. 11 may be utilized to form an energy storage device with a strengthened porous structure. The method illustrated in FIG. 11 may also be implemented during the formation of a porous electrode in such as the conductive structures 110, 120 illustrated in FIG. 1 and FIG. 4 or during the formation of other porous structures described below such as with respect to FIGS. 19-21, and FIGS. 24-25. In an embodiment, the primary current variation may be a non-linear current variation. In an embodiment, the non-linear current variation is approximated by a second or third order polynomial. In an embodiment, the secondary current variation is a linear addition of a sinusoidal function. Such a sinusoidal variation may eliminate abrupt changes in porosity, which reduces stress concentrations and strengthens the porous structure. FIG. 12 is an illustration of a main channel 111 including sidewalls 111A, 111B with a primary linear shape and a superimposed sinusoidal shape, where the sidewalls are substantially parallel. FIG. 13 is an illustration of a main channel 111 including sidewalls 111A, 111B with a primary linear shape and a superimposed sinusoidal shape, where the sidewalls are inwardly tapered. In an embodiment, main channels have an average width of approximately 0.05-5 µm, or more specifically approximately 0.2 µm, and variation of width along the superimposed secondary shape is 2-50 nm, which may be enough to eliminate abrupt changes in porosity and remove high stress concentrations. It is to be appreciated that while the main channels 111 illustrated in FIGS. 12-13 are at an acute angle to the main surface, that such an illustration is exemplary and that embodiments of the invention are not so limited. For example, the superimposed sinusoidal shapes of FIGS. 12-13 can be implemented in the embodiments illustrated in FIGS. 19-21 and FIG. 23B where the main channels are illustrated as being orthogonal to the main surface.

As described above, electrochemical etching may be used to form the porous structure of a porous electrode. In some embodiments, specific etching techniques have been performed in order to increase the surface are or reduce a diffusion path length. In some embodiments, electrochemical etching conditions are further controlled to reduce pore size, thereby increasing pore surface area and capacitance of the energy storage device. In an embodiment, a method of forming a porous electrode includes immersing an electrically conductive substrate in an electrochemical etching bath, and applying an etching current across the electrically conductive substrate to create a porous structure containing multiple main channels within the electrically conductive substrate while maintaining the electrochemical etching bath at approximately room temperature or less. Standard electrochemical etching processes may not control the etching bath temperature, and the temperature often heats up above room temperature during the electrochemical etching process. As electrochemical etching progresses, the substrate being etched is oxidized and then the oxide is etched away. At higher temperatures, the process of oxidation and removal goes quicker. Accordingly, in an embodiment, keeping the etching bath temperature at room temperature or less during electrochemical etching slows down the oxidation and oxide etching process resulting in smaller pores.

In an embodiment, a method of forming a porous electrode includes immersing an electrically conductive substrate in an electrochemical etching bath including a concentration of HF:alcohol of 2:1 or greater concentration HF, and applying an etching current across the electrically conductive substrate to create a porous structure containing multiple main channels within the electrically conductive substrate. In an embodiment, the concentration of HF:alcohol is 3:1 or greater concentration HF. It has been observed that the progression of oxidation and etching away the oxide is the result of lower HF concentration. Accordingly, in an embodiment, the HF:alcohol concentration is increased for HF to 2:1, or more specifically 3:1. In some embodiments, the etching bath temperature is kept at room temperature or lower, and the HF:alcohol concentration is at least 2:1, or more specifically at least 3:1.

Referring now to FIG. 14, a method of forming a porous electrode with an array of V-groove or pyramid recesses is shown according to an embodiment of the invention. At operation 1410 a hard mask is patterned on crystalline substrate to form an array of lines. The crystalline substrate is then etched to form an array of V-groove or pyramid recesses in a main surface of the crystalline substrate at operation 1420. The main surface of the crystalline substrate may be the same main surface of the porous structure as described herein. At operation 1430, multiple main channels are electrochemically etched in the crystalline substrate with the multiple main channels having openings in the array of V-groove or pyramid recesses. The main channels with openings in the main surface may also be formed.

FIGS. 15-16 are top view illustrations of a method of forming an array of V-groove recesses formed in a main surface 115 of the porous structure in accordance with embodiments of the invention. As shown in FIG. 15, a hardmask such as silicon nitride ($Si_3N_4$) is patterned on a crystalline substrate in an array of lines 1510. In the particular embodiment illustrated, the crystalline substrate is an electrically conductive substrate 110 as described herein, but may also be other substrates including, but not limited to, electrically conductive substrate 120. In an embodiment, crystalline substrate is a (100) silicon substrate. Referring now to FIG. 16, an array of V-groove recesses 1660 are etched into the crystalline substrate. In an embodiment, an array of V-groove recesses 1660 are etched into a crystalline (100) silicon substrate forming side surfaces 1660A, 1660B formed along (111) planes. Etching of the array of V-groove recesses may include a suitable etchant with a higher etch selectivity in the <100> plane direction than the <111> plane direction such as a potassium hydroxide (KOH), ethylenediamine pyrocatechol (EDP), or tetramethylammonium hydroxide (TMAH).

FIGS. 17-18 are top view illustrations of a method of forming an array of pyramid recesses formed in a main surface 115 of the porous structure in accordance with embodiments of the invention. As shown in FIG. 17, a hardmask such as silicon nitride ($Si_3N_4$) is patterned on a crystalline substrate in an array of lines 1510. In the particular embodiment illustrated, the crystalline substrate is an electrically conductive structure 110 as described herein, but may also be other substrates including, but not limited to, electrically conductive structure 120. In an embodiment, the crystalline substrate is a (100) silicon substrate. Referring now to FIG. 18, an array of pyramid recesses 1870 are etched into the crystalline substrate. In an embodiment, an array of pyramid recesses 1870 are etched into a crystalline (100) silicon substrate forming side surfaces 1870A, 1870B, 1870C, 1870D formed along (111) planes. Etching of the array of pyramid recesses may include a suitable etchant with a higher etch selectivity in the <100> plane direction than the <111> plane direction such as a potassium hydroxide (KOH), ethylenediamine pyrocatechol (EDP), or tetramethylammonium hydroxide (TMAH).

Referring again to FIG. 16 and FIG. 18, upon removal of the patterned hardmask lines 1510 after etching of the array of V-groove 1660 or pyramid 1870 recesses a substantially flat portion of main surface 115 is exposed. It is to be appreciated however, that the porous structure including multiple main channels is not yet fully formed and that the main surface 115 of the porous structure may also correspond with a main surface of the crystalline substrate, or conductive structure such as conductive structure 110.

FIGS. 19-20 are cross-sectional side view illustrations of a porous structure of an energy storage device containing an array of V-groove 1660 or pyramid 1870 recesses according to an embodiment of the invention after the formation of the multiple main channels. As illustrated, multiple main channels 111 have openings 112 in the array of V-groove 1660 or pyramid 1870 recesses. In the embodiment illustrated in FIG. 19, there are no uppermost flat portions in the main surface 115 of the crystalline substrate 110. In the embodiment illustrated in FIG. 20, the array of V-groove 1660 or pyramid 1870 recesses are separated by uppermost flat portions 116 in the main surface 115 of the crystalline substrate 110. The width of uppermost flat portions 116 or lack thereof, may be controlled by selection of patterned hardmask line 1510, 1710 width.

In the embodiments illustrate din FIGS. 19-20 the main channels 111 are electrochemically etched in the crystalline substrate 110 orthogonal to the flat portions 116 of the main surface 115, where present. For example, where the crystalline substrate is a crystalline (100) silicon substrate, the main channels 111 may be electrochemically etched in the <100> plane direction orthogonal to the (100) surface. It is to be appreciated that while the main channels 111 illustrated in FIGS. 19-20 are orthogonal to the main surface, that such an illustration is exemplary and that embodiments of the invention are not so limited. For example, main channels 111 could be formed at an acute angle to the main surface by orientation of the current line electrochemical etching direction.

Referring now to FIG. 21, a cross-sectional side view illustration is shown of an energy storage device according to an embodiment of the invention. As illustrated, an energy storage device 100 may include a first and second electrically conductive structures 110, 120 (e.g. porous electrodes) and a separator 130 between a porous structure within each of the first and second electrically conductive structures 110, 120. Each porous structure contains an array of V-groove or pyramid recesses in a main surface 115, 125 of the porous structure, and a plurality of main channels 111, 121 extending into the electrically conductive structures 110, 120 for each V-groove or pyramid recess with each main channel 111, 121 having an opening 112, 122 in the corresponding V-groove or pyramid recess. In the embodiment illustrated in FIG. 21, the separator 130 extends into the array of V-groove or pyramid recesses. In an embodiment, the second porous structure of the second conductive structure 120 extends into the array of V-groove or pyramid recesses in the porous structure of the first conductive structure 110. Separator 130 can be formed on the conductive structure 110 in a variety of manners. For example, separator 130 can be deposited or stacked. In an embodiment, separator 130 is a stretchable film placed on conductive substrate 110.

FIG. 22 is a flowchart illustrating a method of forming an energy storage device according to an embodiment of the invention. FIGS. 23A-23B are cross-section side view illustrations of a energy storage device 2300 according to embodiments of the invention. At operation 2210 a separator layer 130 is formed over a first conductive porous electrode containing multiple main channels 111, with each main channel having an opening to a main surface 115 of the first conductive porous electrode. Separator 130 can be formed on the first conductive porous electrode in a variety of manners. For example, separator 130 can be deposited or stacked. In an embodiment, separator 130 is a stretchable film placed on the first conductive porous electrode. The conductive porous electrode may be any of the conductive structures described herein. In an embodiment, the conductive porous electrode is conductive structure 110 as illustrated in FIG. 1, FIG. 4, FIGS. 19-21, or any of the variations thereof. In the embodiment illustrated in FIG. 23A, the main surface 115 is relatively flat. In the embodiment, illustrated in FIG. 23B, an array of V-groove 1160 or pyramid 1870 recesses are formed in the main surface 115. The multiple main channels 111 may extend into the conductive structure 110 orthogonal to the main surface 115 of the porous structure, or may extend into the conductive structure 110 at an acute angle to the main surface 115. At operation 2220, a second electrically conductive porous electrode 2320 is deposited onto the separator layer 130 using a suitable thin film deposition technique such as chemical vapor deposition (CVD), spin coating, physical vapor deposition (PVD), and electroplating. In an embodiment, the second electrically conductive porous electrode 130 is a material such as carbon, carbon-based material, or pseudocapacitive material, and the first electrically conductive porous electrode is a material selected from the group consisting of silicon, silicon carbide, germanium, and tin. In an embodiment, the second electrically conductive porous electrode is CVD deposited lithium-doped carbon. In an embodiment, the second electrically conductive porous electrode is a nanodiamond carbon film. The nanodiamond carbon film may be associated with heat sinking. In the hybrid material approaches illustrated in FIGS. 23A-23B, the first porous electrode may be integrated with other circuitry 2330 in an electrically conductive substrate. For example, circuitry 2330 may be an integrated circuit formed within a silicon substrate 110, which is also the electrically conductive structure 110 forming the first porous electrode. In an embodiment, the energy storage device 2300 is located on the same electrically conductive structure 110 as a microprocessor. In another embodiment, the energy storage device 2300 is located on an electrically conductive structure 110 of the microprocessor. In an embodiment, the energy storage device 2300 is formed within a casing of a mobile electronic device such as a mobile telephone, a laptop computer, or a tablet computer. In an embodiment, the energy storage device is formed on a silicon bridge connecting two die.

Referring now to FIG. 24 a method of forming an energy storage device is illustrated according to an embodiment of the invention. At operation 2410 an electrically conductive substrate is electrochemically etched to release a porous structure from the electrically conductive substrate. FIG. 25 is a cross-sectional side view illustration of a porous structure 2512 released from an electrically conductive substrate 2510 in an electrochemical etching bath 2500 according to an embodiment of the invention. For illustrational purposes, the electrochemical etching bath 2500 may include a pair of electrodes 2502, 2504 such as platinum net electrodes mounted into each side of the tank 2506. In another embodiment, the electrochemical etching bath can be a horizontal etching bath. Electrically conductive substrate 2510 can be mounted into a removable substrate holder 2520 which can be placed in front of an opening in the separation plate 2530 and fixed into place with a bayonette catch. When the catch is closed, the left and right compartments are electrically isolated from each other. The electrochemical etching bath 2500 may be filled with enough etching solution 2540 to cover the electrically conductive substrate 2510 and electrodes 2502, 2504. For example, where the substrate comprises silicon, exemplary etching solutions include hydrofluoric acid (HF) and HF-ethanol solutions.

Electrochemical etching of a porous structure 2512 into the electrically conductive substrate 2510 may be performed in accordance with conventional techniques. For example, a constant current can be maintained between the negative and positive electrodes 2502, 2504. It may be required to vary the voltage somewhat during electrochemical etching due to loss in electrical conductivity of etching solution 2540 in the etching bath 2500. Further, any of the etching variations described herein may be combined with the method described with regard to FIG. 24, such as, for example, to increase porous electrode surface are, reduce diffusion path, reduce pore size, and increase pore strength. The porous structure 2512 may be etched into the substrate 2510 on the side of negatively charged electrode 2502. In an embodiment, regime etching used to release the porous structure 2512 from the electrically conductive substrate 2510. For example, the electrochemical etching current may be rapidly ramped up to release the porous structure 2512.

Referring again to FIG. 24, the porous structure 2512 may then be joined with a separator layer and a second porous structure to form an energy storage device. Joining may be formed in a variety of manners. For example, joining may include depositing a separator layer on the porous structure. Joining may include stacking the porous structure on the separator layer, or stacking the separator layer on the porous structure. Joining may also include stacking a second porous structure on the separator layer. The second porous structure may be formed in the same or different manner as porous structure 2512.

FIG. 26 is a block diagram representing a mobile electronic device 2600 according to an embodiment of the invention. As illustrated in FIG. 26, mobile electronic device 2600 comprises a substrate 2610 on which a microprocessor 2620 and an energy storage device 2630 associated with microprocessor 2620 are disposed. Energy storage device 2630 can either be located on substrate 2610 away from microprocessor 2620, as illustrated in solid lines, or it can be located on microprocessor 2620 itself, as illustrated in dashed lines. In one embodiment energy storage device 2630 comprises first and second electrically conductive structures separated from each other by a separator, where at least one of the first and second electrically conductive structures comprises a porous structure containing multiple channels. As an example, this embodiment can be similar to one or more of the embodiments shown in any of the preceding figures and described in the accompanying text.

In at least some embodiments energy storage device 2630 is one of a plurality of energy storage devices, which may be stacked in series, (all of which are represented in FIG. 26 by block 2630) contained within mobile electronic device 2600. In one or more of those embodiments mobile electronic device 2600 further comprises a switching network 2640 associated with the energy storage devices. When a capacitor is being discharged it doesn't maintain a constant voltage but instead decays in an exponential manner (unlike a battery where the voltage stays relatively constant during discharge). Switching network 2640 comprises circuitry or some other mechanism that switches in and out various capacitors such that a relatively constant voltage is maintained. For example, the energy storage devices could initially be connected to each other in parallel and then, after a certain amount of voltage decay, a subset of the energy storage devices could be changed by the switching network so as to be connected in series such that their individual voltage contributions can boost the declining overall voltage. In one embodiment switching network 2640 could be implemented using existing silicon device technology as used in the art (transistors, silicon controlled rectifiers (SCRs), etc.), while in other embodiments it could be implemented using micro-electromechanical systems (MEMS) relays or switches (which, it may be noted, tend to have very low resistance).

In some embodiments mobile electronic device 2600 further comprises a sensor network 2650 associated with energy storage devices 2630. In at least some embodiments each one of the plurality of energy storage devices will have its own sensor that indicates certain behavioral parameters of the energy storage device. For example, the sensors may indicate existing voltage levels as well as the ongoing discharge response, both of which are parameters that may be used by the switching network—especially in cases where the dielectric material (or other electrical insulator) being used is not linear but rather has a dielectric constant that varies with the voltage. In those cases, it may be advantageous to include along with the sensor network a finite state machine such as a voltage control unit 2660 that knows what the behavior of the dielectric is and responds accordingly. A voltage control unit that knows how the dielectric behaves can compensate for any non-linearity. A temperature sensor 2670 associated with energy storage devices 2630 may also be included in order to sense temperature (or other safety-related parameters). In certain embodiments of the invention, mobile electronic device 2600 further comprises one or more of: a display 2681, antenna/RF elements 2682, a network interface 2683, a data entry device 2684 (e.g., a keypad or a touchscreen), a microphone 2685, a camera 2686, a video projector 2687, a global positioning system (GPS) receiver 2688, and the like.

FIG. 27 is a block diagram representing a microelectronic device 2700 according to an embodiment of the invention. As illustrated in FIG. 27, microelectronic device 2700 comprises a substrate 2710, a microprocessor 2720 over substrate 2710, and an energy storage device 2730 associated with microprocessor 2720. Energy storage device 2730 can either be located on substrate 2710 away from microprocessor 2720 (e.g., a die-side capacitor), as illustrated in solid lines, or it can be located on microprocessor 2720 itself (e.g., in a build-up layer above the microprocessor), as illustrated in dashed lines. In one embodiment, energy storage device 2730 comprises first and second electrically conductive structures separated from each other by a separator, where at least one of the first and second electrically conductive structures comprises a porous structure. As an example, this embodiment can be similar to one or more of the embodiments shown in any of the preceding figures described in the accompanying text. In another embodiment, energy storage device 2730 comprises a plurality of electrically conductive structures comprising porous structures stacked in series. In an embodiment, energy storage device 2730 includes a porous structure that includes multiple main channels extending into the porous structure at an acute angle to a main surface of the porous structure. In an embodiment, energy storage device 2730 includes a porous structure that includes an array of V-grooves or pyramid recesses in a main structure, and a plurality of main channels extend into each V-groove or pyramid recess. In an embodiment, energy storage device 2730 includes a porous structure that includes multiple main channels with sidewalls including a primary surface shape and a secondary surface shape superimposed on the primary surface shape. In an embodiment, energy storage device 2730 includes a first porous electrode comprising silicon, silicon carbide, germanium, tin, and a pseudocapacitive material, and energy storage device 2730 includes a second porous electrode comprising carbon, carbon-based material, silicon carbide, and silicon.

The energy storage devices disclosed herein may in some embodiments be used as a decoupling capacitor within microelectronic device 2700—one that is smaller and that, for the reasons described elsewhere herein, offers much higher capacitance and much lower impedance than existing decoupling capacitors. As already mentioned, energy storage device 2730 can be part of a support integrated circuit (IC) or chip or it can be located on the microprocessor die itself. As an example, one might, according to embodiments of the invention, be able to form regions of porous silicon (or the like, as described above) on a microprocessor die and then create a high-surface-area embedded decoupling capacitor right on the substrate of the microprocessor die. Because of the porosity of the silicon, the embedded capacitor would have very high surface area. Other possible uses for the disclosed energy storage devices include use as a memory storage element (where problems with the z-direction size of embedded DRAM approaches may be solved by greatly increasing the farads per unit area) or as a component of voltage converters in voltage boost circuitry, perhaps for use with circuit blocks, individual microprocessor cores, or the like. In an embodiment, the energy storage device is incorporated within an electronic device, the energy storage device being associated with a microprocessor. For example, the energy storage device may be formed within a casing of a mobile electronic device such as a mobile telephone, a laptop computer, and a tablet computer. In an embodiment, the energy storage device is formed on a silicon bridge connecting two die.

As an example, higher capacitance values could in this context be advantageous because parts of the circuit could then run nominally at a certain (relatively low) voltage but then in places where higher voltage is needed in order to increase speed (e.g., cache memory, input/output (I/O) applications) the voltage could be boosted to a higher value. An operational scheme of this sort would likely be preferred over one in which the higher voltage is used everywhere; i.e., in cases where only a small amount of circuitry requires a higher voltage it likely would be preferable to boost voltage from a lower baseline voltage for that small portion of the circuit rather than drop voltage from a higher baseline value for the majority of the circuitry. Future microprocessor generations may also make use of voltage converters of the type described here. Having more capacitance available to be deployed around a package or around a microprocessor die may help solve the existing issue of intolerably high inductance between transistors that transfer voltage around a circuit.

The following examples are provided as particular implementations of embodiments of the invention, and are meant to be illustrative rather than limiting.

As a first exemplary embodiment, an energy storage device includes a porous structure containing multiple main channels within an electrically conductive structure; wherein each one of the main channels has an opening to a main surface of the porous structure, and each of the main channels extends into the electrically conductive structure at an acute angle to the main surface. Each main channel may extend into the electrically conductive structure along a crystal plane direction oriented at the acute angle to the main surface. Side channels may extend from a side surface of each of the main channels into the electrically conductive structure. Where the main surface is a (1011) surface, each of the main channels extends into the electrically conductive structure along a <100> crystal plane direction at the acute angle to the main surface. Side channels may also extend from a side surface of each of the main channels extending into the electrically conductive structure along a <100> crystal plane direction. Where the main surface is a (322) surface, each of the main channels extends into the electrically conductive structure along a <100> crystal plane direction at the acute angle to the main surface. Side channels may also extend from a side surface of each of the main channels extending into the electrically conductive structure along a <100> crystal plane direction. Where the main surface is a (111) surface, each of the main channels extends into the electrically conductive structure along a <113> crystal plane direction at the acute angle to the main surface. Side channels may also extend from a side surface of each of the main channels extending into the electrically conductive structure along a <113> crystal plane direction. The energy storage device may also include a second porous structure in a second electrically conductive structure, and a separator between the porous structure and the second porous structure. The second porous structure may contain multiple second main channels, and each one of the second main channels has a second opening to a second main surface of the second porous structure, and each of the second main channels extends into the second electrically conductive structure at a second acute angle to the second main surface. The multiple main channels and the multiple second main channels may be parallel to each other. The main surface and the second main surface may be formed along the same crystallographic plane, such as a (1011), (322), (111), or (5512) plane. The energy storage device may be incorporated within an electronic device, and associated with a microprocessor. For example, the energy storage device may be formed within a casing of a mobile electronic device such as a mobile telephone, laptop computer, and tablet computer. The energy storage device may be formed on a silicon bridge connecting two die. Each of the main channels in the energy storage device may extend into the electrically conductive structure with sidewalls including a primary surface shape and a secondary surface shape superimposed on the primary surface shape. For example, the primary surface shape may be linear. For example, the primary surface shape may be a linear taper. In an embodiment, the secondary surface shape is sinusoidal. In an embodiment, the secondary surface shape includes alternating reservoir regions and connecting regions.

As a second exemplary embodiment, a method of forming a porous electrode includes electrochemically etching multiple main channels into an electrically conductive substrate so each main channel has an opening to a main surface of the substrate, and each one of the main channels extends into the substrate at an acute angle to the main surface. The multiple main channels may be formed along a direction of current flow in an electrochemical etching bath. The multiple main channels may be formed along a crystallographic plane direction in the substrate. Electrochemical etching may include immersing the substrate in an etching bath including hydrofluoric acid (HF) or dimethyl sulfoxide (DMSO). Electrochemical etching the multiple main channels into the electrically conductive substrate may further include immersing the electrically conductive substrate in an electrochemical etching bath, applying an etching current across the electrically conductive substrate, and varying the etching current in a non-linear fashion to create a porous structure containing the multiple main channels within the electrically conductive substrate. Varying the etching current in a non-linear fashion may include varying the etching current in alternating nodes of relatively higher and lower current. This may result in each main channel including alternating reservoir regions and connecting regions, where the reservoir regions are wider than the connecting regions. Varying the etching current in a non-linear fashion may include continuously lowering the etching current. This may result in each main channel including continuously inwardly tapered sidewalls from the main surface to a bottom surface of each main channel. Electrochemically etching the multiple channels into the electrically conductive substrate may include immersing the electrically conductive substrate in an electrochemical etching bath, and applying an etching current across the electrically conductive substrate to create a porous structure containing the multiple main channels within the electrically conductive substrate, with the etching current including a secondary etching current variation superimposed on a primary etching current variation. The primary etching current variation may be a non-linear current variation. The secondary etching current variation may be a linear addition of a sinusoidal function. The non-linear current variation may be approximated by a second or third order polynomial. In an embodiment, the multiple main channels comprise sidewalls with a primary linear shape and a superimposed sinusoidal shape. Electrochemically etching the multiple main channels into the electrically conductive substrate may include electrochemically etching the electrically conductive substrate to release a porous structure containing the multiple main channels from the electrically conductive substrate. Electrochemically etching the multiple main channels into the electrically conductive substrate may include maintaining an electrochemical etching bath at approximately room temperature or less. Electrochemically etching the multiple main channels into the electrically conductive substrate may include immersing the electrically conductive substrate in an electrochemical etching bath including a concentration of HF:alcohol of 2:1 or greater concentration HF. In an embodiment, the etching bath includes a concentration of HF:alcohol of 3:1 or greater concentration HF.

As a third exemplary embodiment, an energy storage device includes a porous structure within an electrically conductive structure, the porous structure containing an array of V-groove or pyramid recesses in a main surface of the porous structure, and a plurality of main channels extending into the electrically conductive structure for each V-groove or pyramid recess, with each main channel having an opening in the corresponding V-groove or pyramid recess. The main surface may be a (100) plane. Each V-groove or pyramid recess may include a side surface extending along a <111> plane direction in the electrically conductive structure. The energy storage device may also include a second porous structure within a second electrically conductive structure, and a separator between the porous structure and the second porous structure. The separator may extend into the array of V-groove or pyramid recesses. The second porous structure may extend into the array of V-groove or pyramid recesses. The second electrically conductive structure may be a material such as carbon, carbon-based material, and a pseudocapacitive material. The second porous structure may contain a second array of V-groove or pyramid recesses in a second main surface of the second porous structure, and a second array of main channels extend into the second electrically conductive structure with each main channel having an opening in the corresponding V-groove or pyramid recess. The second porous structure may extend into the V-groove or pyramid recesses of the porous structure. The separator may completely fill the array of V-groove or pyramid recesses. The energy storage device may be formed on a silicon bridge connecting two die. Each of the main channels in the energy storage device may extend into the electrically conductive structure with sidewalls including a primary surface shape and a secondary surface shape superimposed on the primary surface shape. For example, the primary surface shape may be linear. For example, the primary surface shape may be a linear taper. In an embodiment, the secondary surface shape is sinusoidal. In an embodiment, the secondary surface shape includes alternating reservoir regions and connecting regions. Each of the main channels in the energy storage device may extend into the electrically conductive structure with sidewalls including a primary surface shape and a secondary surface shape superimposed on the primary surface shape. For example, the primary surface shape may be linear. For example, the primary surface shape may be a linear taper. In an embodiment, the secondary surface shape is sinusoidal. In an embodiment, the secondary surface shape includes alternating reservoir regions and connecting regions. In an embodiment, the second porous electrode includes lithium-doped carbon. In an embodiment, the second porous electrode includes a nanodiamond film.

As a fourth exemplary embodiment, a method of forming a porous electrode includes patterning a hard mask on a crystalline substrate to form an array of lines, etching an array of V-groove or pyramid recesses in a main surface of the crystalline substrate, and electrochemically etching multiple main channels in the crystalline substrate, with each of the multiple main channels having an opening in the array of V-groove or pyramid recesses. In an embodiment, the crystalline substrate is a (100) silicon substrate, and etching of the V-groove or pyramid recesses includes a potassium hydroxide (KOH) etchant. The method may also include forming a separator layer over the array of V-groove or pyramid recesses, and depositing a porous electrode on the separator layer. In an embodiment, the porous electrode is deposited with chemical vapor deposition (CVD). Electrochemically etching the multiple main channels in the crystalline substrate may include immersing the crystalline substrate in an electrochemical etching bath, applying an etching current across the crystalline substrate, and varying the etching current in a non-linear fashion to create a porous structure containing the multiple main channels in the crystalline substrate, where each one of the main channels has an opening to a surface in the array of V-groove or pyramid recesses. Varying the etching current in a non-linear fashion may include varying the etching current in alternating nodes of relatively higher and lower current. This may result in each main channel including alternating reservoir regions and connecting regions, where the reservoir regions are wider than the connecting regions. Varying the etching current in a non-linear fashion may include continuously lowering the etching current. This may result in each main channel including continuously inwardly tapered sidewalls from the main surface to a bottom surface of each main channel. Electrochemically etching the multiple channels into the crystalline substrate may include immersing the crystalline substrate in an electrochemical etching bath, and applying an etching current across the crystalline substrate to create a porous structure containing the multiple main channels within the crystalline substrate, with the etching current including a secondary etching current variation superimposed on a primary etching current variation. The primary etching current variation may be a non-linear current variation. The secondary etching current variation may be a linear addition of a sinusoidal function. The non-linear current variation may be approximated by a second or third order polynomial. In an embodiment, the multiple main channels comprise sidewalls with a primary linear shape and a superimposed sinusoidal shape. Electrochemically etching the multiple main channels into the crystalline substrate may include electrochemically etching the electrically crystalline substrate to release a porous structure containing the multiple main channels from the crystalline substrate. Electrochemically etching the multiple main channels into the crystalline substrate may include maintaining an electrochemical etching bath at approximately room temperature or less. Electrochemically etching the multiple main channels into the crystalline substrate may include immersing the crystalline substrate in an electrochemical etching bath including a concentration of HF:alcohol of 2:1 or greater concentration HF. In an embodiment, the etching bath includes a concentration of HF:alcohol of 3:1 or greater concentration HF.

As a fifth exemplary embodiment, a method of forming a porous electrode includes immersing an electrically conductive substrate in an electrochemical etching bath, applying an etching current across the electrically conductive substrate, and varying the etching current in a non-linear fashion to create a porous structure containing the multiple main channels in the electrically conductive substrate, where each one of the main channels has an opening to a main surface of the porous structure. Varying the etching current in a non-linear fashion may include varying the etching current in alternating nodes of relatively higher and lower current. This may result in each main channel including alternating reservoir regions and connecting regions, where the reservoir regions are wider than the connecting regions. Varying the etching current in a non-linear fashion may include continuously lowering the etching current. This may result in each main channel including continuously inwardly tapered sidewalls from the main surface to a bottom surface of each main channel.

As a sixth exemplary embodiment, a method of forming a porous electrode includes immersing an electrically conductive substrate in an electrochemical etching bath, and applying an etching current across the electrically conductive substrate to create a porous structure containing the multiple main channels in the electrically conductive substrate, where each one of the main channels has an opening to a main surface of the porous structure, and with the etching current including a secondary etching current variation superimposed on a primary etching current variation. The primary etching current variation may be a non-linear current variation. The secondary etching current variation may be a linear addition of a sinusoidal function. The non-linear current variation may be approximated by a second or third order polynomial. In an embodiment, the multiple main channels comprise sidewalls with a primary linear shape and a superimposed sinusoidal shape.

As a seventh exemplary embodiment, an energy storage device includes a porous structure containing multiple main channels within an electrically conductive structure, where each one of the main channels has an opening to a main surface of the porous structure, and each of the main channels extends into the electrically conductive structure with sidewalls including a primary surface shape and a secondary surface shape superimposed on the primary surface shape. For example, the primary surface shape may be linear. For example, the primary surface shape may be a linear taper. In an embodiment, the secondary surface shape is sinusoidal. In an embodiment, the secondary surface shape includes alternating reservoir regions and connecting regions.

As an eighth exemplary embodiment, a method of forming an energy storage device includes forming a separator layer over a first electrically conductive porous electrode, where the first electrically conductive porous electrode contains multiple main channels, where each one of the main channels has an opening to a main surface of the first conductive porous electrode, and depositing a second conductive porous electrode on the separator layer. The method may also include electrochemically etching an electrically conductive substrate to form the first electrically conductive porous electrode. Depositing the second conductive porous electrode may include an operation such as chemical vapor deposition (CVD), spin coating, physical vapor deposition (PVD), and electroplating.

As a ninth exemplary embodiment, an energy storage device includes a first porous electrode containing multiple main channels, where each one of the main channels has an opening to a main surface of the first porous electrode, and where the first porous electrode includes silicon, silicon carbide, germanium, or tin; a separator is on the first porous electrode; and a second electrode is on the separator layer, where the second porous electrode includes carbon, a carbon-based material, or a pseudocapacitive material. In an embodiment, the second porous electrode includes lithium-doped carbon. In an embodiment, the second porous electrode includes a nanodiamond film.

As a tenth exemplary embodiment, a method of forming an energy storage device includes electrochemically etching an electrically conductive substrate to release a porous structure from the electrically conductive substrate, and joining the porous structure with a separator layer and a second porous structure. Joining may include depositing the separator layer on the porous structure. Joining may include stacking the porous structure on the separator layer. Joining may include stacking the separator layer on the porous structure. Joining may include stacking the second porous structure on the stacked separator layer. The method may also include electrochemically etching a second electrically conductive substrate to release the second porous structure from the second electrically conductive substrate.

As an eleventh embodiment, a method of forming a porous electrode includes immersing an electrically conductive substrate in an electrochemical etching bath, and applying an etching current across the electrically conductive substrate to create a porous structure containing multiple main channels within the electrically conductive substrate while maintaining the electrochemical etching bath at approximately room temperature or less, where each one of the main channels has an opening to a main surface of the porous structure. In an embodiment, the etching bath includes a concentration of HF:alcohol of 2:1 or greater concentration HF.

As a twelfth exemplary embodiment, a method of forming a porous electrode includes immersing an electrically conductive substrate in an electrochemical etching bath including a concentration of HF:alcohol of 2:1 or greater concentration HF, and applying an etching current across the electrically conductive substrate to create a porous structure containing multiple main channels within the electrically conductive substrate, where each one of the main channels has an opening to a main surface of the porous structure. In an embodiment, the etching bath includes a concentration of HF:alcohol of 3:1 or greater concentration HF.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:
1. An energy storage device comprising:
a porous structure containing multiple main channels within an electrically conductive structure and side channels extending from a first side surface of each of the main channels into the electrically conductive structure;

wherein each one of the main channels has an opening to a main surface of the porous structure, and each of the main channels extends into the electrically conductive structure at an acute angle to the main surface, and wherein each of the main channels includes alternating reservoir regions and connecting regions where the reservoir regions are wider than the connecting regions, and wherein the reservoir regions and the connecting regions form an hourglass shape.

2. The energy storage device of claim 1, wherein each main channel extends into the electrically conductive structure along a crystal plane direction oriented at the acute angle to the main surface.

3. The energy storage device of claim 1, wherein:
the main surface is a (1011) surface, and each of the main channels extend into the electrically conductive structure along a <100> crystal plane direction at the acute angle to the main surface;
the main surface is a (322) surface, and each of the main channels extend into the electrically conductive structure along a <100> crystal plane direction at the acute angle to the main surface;
the main surface is a (111) surface, and each of the main channels extend into the electrically conductive structure along a <113> crystal plane direction at the acute angle to the main surface; or
the main surface is a (5512) surface, and each of the main channels extend into the electrically conductive structure along a <100> crystal plane direction at the acute angle to the main surface.

4. The energy storage device of claim 1, wherein the energy storage device is incorporated within an electronic device, the energy storage device being associated with a microprocessor.

5. The energy storage device of claim 1, wherein each of the main channels extends into the electrically conductive structure with sidewalls including a primary surface shape and a secondary surface shape superimposed on the primary surface shape.

6. The energy storage device of claim 5, wherein the primary surface shape is a linear taper.

7. The energy storage device of claim 6, wherein the secondary surface shape is sinusoidal.

8. An energy storage device comprising:
a porous structure containing multiple main channels within an electrically conductive structure;
wherein each one of the main channels has an opening to a main surface of the porous structure, and each of the main channels extends into the electrically conductive structure at an acute angle to the main surface, and wherein each of the main channels includes alternating reservoir regions and connecting regions where the reservoir regions are wider than the connecting regions, and wherein the reservoir regions and the connecting regions form an hourglass shape;
a second porous structure in a second electrically conductive structure; and
a separator between the porous structure and the second porous structure.

9. The energy storage device of claim 8, wherein the second porous structure contains multiple second main channels, and each one of the second main channels has a second opening to a second main surface of the second porous structure, and each of the second main channels extends into the second electrically conductive structure at a second acute angle to the second main surface; and
wherein the main surface and the second main surface are parallel to each other and formed along a same crystallographic plane.

* * * * *